US007692239B2

(12) United States Patent
Nagaoka

(10) Patent No.: US 7,692,239 B2
(45) Date of Patent: Apr. 6, 2010

(54) MIS-TYPE SEMICONDUCTOR DEVICE

(75) Inventor: Tatsuji Nagaoka, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/383,097

(22) Filed: May 12, 2006

(65) Prior Publication Data
US 2006/0194392 A1    Aug. 31, 2006

Related U.S. Application Data

(62) Division of application No. 10/781,360, filed on Feb. 18, 2004, now Pat. No. 7,067,877.

(30) Foreign Application Priority Data

Mar. 10, 2003    (JP)    ............................. 2003-063161
Jul. 16, 2003    (JP)    ............................. 2003-197644

(51) Int. Cl.
  *H01L 29/76*    (2006.01)
  *H01L 29/94*    (2006.01)
  *H01L 31/062*   (2006.01)
  *H01L 31/113*   (2006.01)
  *H01L 31/119*   (2006.01)
  *H01L 23/58*    (2006.01)

(52) U.S. Cl. ...................... 257/335; 257/337; 257/339; 257/401; 257/488; 257/E29.001; 257/E29.012

(58) Field of Classification Search ................ 257/335, 257/337, 339, 488, 401, E29.001, E29.012
See application file for complete search history.

(56) References Cited

U.S. PATENT DOCUMENTS 4,860,072 A * 8/1989 Zommer .................... 257/144

4,963,951 A * 10/1990 Adler et al. .................. 257/141

(Continued)

FOREIGN PATENT DOCUMENTS

JP    56-070662 A    6/1981

(Continued)

OTHER PUBLICATIONS

Japanese Office Action "Notification of Reasons of Refusal" for Patent Application No. 2003-197644, Oct. 16, 2009. (Partial Translation).

*Primary Examiner*—Ida M Soward
(74) *Attorney, Agent, or Firm*—Rossi, Kimms & McDowell LLP

(57) ABSTRACT

A MIS-type semiconductor device has reduced ON-resistance by securing an overlapping area between the gate electrode and the drift region, and has low switching losses by reducing the feedback capacitance. The MIS-type semiconductor device includes a p-type base region, an n-type drift region, a $p^+$-type stopper region in the base region, a gate insulation film on the base region, a gate electrode on the gate insulation film, an oxide film on the drift region, a field plate on the oxide film, and a source electrode. The position (P) of the impurity concentration peak in base region is located more closely to the drift region. The oxide film is thinner on the side of the gate electrode. The field plate is connected electrically to the source electrode, the spacing (dg) between the gate insulation film and the stopper region is 2.5 μm or narrower, and the minimum spacing (x) between the drain region and the stopper region is 5.6 μm or narrower. The minimum thickness of the oxide film is equal to or larger than the thickness of the gate insulation film and equal to or smaller than the ratio Vb/Ec of the breakdown voltage Vb to the critical dielectric breakdown strength of silicon Ec. The drift region can be formed of first and second drift regions, with the first drift region being more heavily doped. The gate electrode and the drift region can be buried.

17 Claims, 15 Drawing Sheets

50 . . . SEMICONDUCTOR SUBSTRATE

U.S. PATENT DOCUMENTS

| | | | |
|---|---|---|---|
| 5,178,370 A * | 1/1993 | Clark et al. | 257/212 |
| 5,473,176 A * | 12/1995 | Kakumoto | 257/192 |
| 5,567,629 A * | 10/1996 | Kubo | 438/286 |
| 5,612,564 A * | 3/1997 | Fujishima et al. | 257/341 |
| 5,621,234 A * | 4/1997 | Kato | 257/339 |
| 5,701,026 A | 12/1997 | Fujishima et al. | |
| 5,705,835 A * | 1/1998 | Nishiura et al. | 257/147 |
| 5,753,942 A * | 5/1998 | Seok | 257/133 |
| 5,981,996 A * | 11/1999 | Fujishima | 257/335 |
| 6,693,338 B2 * | 2/2004 | Saitoh et al. | 257/492 |
| 6,724,040 B2 * | 4/2004 | Fujihira | 257/328 |
| 6,822,292 B2 * | 11/2004 | Beasom | 257/343 |
| 6,831,332 B2 * | 12/2004 | D'Anna et al. | 257/343 |
| 7,033,891 B2 * | 4/2006 | Wilson et al. | 438/270 |
| 7,122,861 B2 * | 10/2006 | Mori | 257/339 |
| 2002/0013029 A1 * | 1/2002 | Hwang | 438/268 |
| 2002/0045301 A1 * | 4/2002 | Sicard et al. | 438/197 |
| 2003/0073287 A1 * | 4/2003 | Kocon | 438/259 |
| 2003/0122222 A1 * | 7/2003 | Okumura et al. | 257/653 |
| 2003/0209741 A1 * | 11/2003 | Saitoh et al. | 257/288 |
| 2003/0213993 A1 * | 11/2003 | Spring et al. | 257/330 |
| 2004/0108551 A1 | 6/2004 | Kitamura et al. | |
| 2004/0124465 A1 | 7/2004 | Onishi et al. | |

FOREIGN PATENT DOCUMENTS

| | | |
|---|---|---|
| JP | 57-030371 A | 2/1982 |
| JP | 62-041428 A | 2/1987 |
| JP | 63-081862 A | 4/1988 |
| JP | 04-196360 A | 7/1992 |
| JP | 06-029522 A | 2/1994 |
| JP | 07-050413 A | 2/1995 |
| JP | 8-181313 A | 7/1996 |
| JP | 08-250731 A | 9/1996 |
| JP | 08-250732 A | 9/1996 |
| JP | 09-036359 A | 2/1997 |
| JP | 2000-252465 A | 9/2000 |
| JP | 2000-294803 A | 10/2000 |
| JP | 2002-009283 A | 1/2002 |
| JP | 2002-158348 A | 5/2002 |
| JP | 2002-170952 A | 6/2002 |

* cited by examiner

1a ··· n+ DRIFT REGION

1b ··· n- DRIFT REGION

BREAKDOWN VOLTAGE 38.4V (3V/LINE)

MIS-TYPE SEMICONDUCTOR DEVICE

This is a divisional of application Ser. No. 10/781,360, filed Feb. 18, 2004.

BACKGROUND

Improvements, which have been performed vigorously for the MIS-type semiconductor devices, include optimization of the threshold gate voltage, reduction of the channel resistance, increase of the interrupting current, reduction of the leakage current, strengthening of the avalanche withstanding capability, and reduction of the switching loss. The examples that have improved these items will be described below.

FIG. 27 is a cross sectional view of a conventional MIS-type semiconductor device that prevents lowering of the threshold gate voltage when the channel is shortened (when the channel width is narrowed), reduces the deviations of the threshold gate voltage caused by irregular machining of the gate, and exhibits a high mobility, as disclosed in Japanese Unexamined Laid Open Patent Application H06 (1994)-29522. Here, the conventional MIS-type semiconductor device includes a channel region, the surface portion thereof is doped lightly. Hereinafter, the lightly doped surface portion of the channel region will be referred to as the "lightly doped surface layer 105." The conventional MIS-type semiconductor device further includes buried layers 106, 107 formed below lightly doped surface layer 105, which buried layers are doped more heavily than lightly doped surface layer 105. The heavily doped buried layers 106, 107 are formed more shallowly than the depletion layer expanding from the surface of the semiconductor chip when an inversion layer is formed in the lightly doped surface layer 105. The buried layers 107, 107, extended from the channel edge for a certain distance $L_P$ into the channel region, are doped more heavily than the buried layer 106 positioned in the center of the channel region (between the buried layers 107, 107).

In the structure described above, the lowering of the threshold gate voltage caused by the shortened channel length is compensated by the rise of the threshold gate voltage due to the extension of heavily doped buried layers 107, 107 for the distance $L_P$. Since the surface layer 105, in which a channel is formed, is doped lightly, a high mobility is realized. FIG. 27 also illustrates a silicon substrate 101, element separation films 102, a gate electrode 103, source/drain layers 104, interlayer insulation films 108, aluminum wiring layers 110, and a gate insulation film 111.

FIG. 28 is a cross sectional view of a conventional SiC (silicon carbide) trench MOSFET, in which a gate electrode is buried in a trench. The conventional trench MOSFET shown in FIG. 28 increases the controllable current, improving the avalanche withstanding capability, and reducing the ON-resistance, as disclosed in Japanese Unexamined Laid Open Patent Application H09 (1997)-36359. Here, the conventional trench MOSFET includes a trench 215, a p-type base region 213, and a $p^+$-type buried region 220, which is doped more heavily than the p-type base region 213 and formed in the p-type base region 213, but not in the vicinity of the trench 215. This structure lowers the substantial resistance of the p-type base region 213 and increases the controllable current. A $p^+$-type buried layer (not illustrated) formed below the bottom of the trench 215 promotes depletion layer expansion when a voltage is applied, preventing dielectric breakdown of the gate insulation film, and improving the avalanche withstanding capability. FIG. 28 also illustrates an $n^+$-type substrate 211, an n-type drift layer 212, a source layer 214, a gate oxide film 216, a gate electrode 217, a source electrode 218, and a drain electrode 219.

FIG. 29 is a cross sectional view of a conventional MOSFET that suppresses the leakage current, as disclosed in Japanese Unexamined Laid Open Patent Application 2002-9283. Here, the conventional MOSFET includes a well region 301, a heavily doped drain region 302 in the surface portion of the well region 301, a lightly doped drain region 303 in another surface portion of the well region 301, and an impurity region 315 below the heavily doped drain region 302 and the lightly doped drain region 303. The impurity region 315 is provided with a polarity opposite to the polarity of the drain regions 302, 303 and doped more heavily than the well region 301 so that the depletion layer between the drain regions 302, 303 and the well region 301 can be prevented from expanding toward the well region 301. Since this structure prevents especially the depletion layer below the lightly doped drain region 303 from expanding toward the well region 301, this structure is very effective to suppress the current flowing through the region deeper than the channel. FIG. 29 also illustrates a heavily doped source region 304, a lightly doped source region 305, a gate electrode 306, a gate oxide film 307, a field oxide film 308, a field doped region 309, an interlayer insulation film 310, a protection film 311, a drain wiring 312, and a source wiring 313.

Now switching loss reduction for the MIS-type semiconductor devices will be described. The feedback capacitance affects greatly the switching characteristics of the MIS-type semiconductor devices. It has been known to reduce the feedback capacitance to reduce the energy loss in switching. Therefore, it is necessary for the conventional MIS-type semiconductor devices to minimize the overlapping area between the gate electrode and the drift region so that the capacitance between the gate and the drain, that is the feedback capacitance, can be reduced. Note that the feedback capacitance becomes larger as the depletion region (the length in the cross sectional view FIG. 29) expanding in the boundary portion of the semiconductor chip in the vicinity of the gate insulation film beneath the gate electrode becomes larger (longer).

The lateral trench MISFET disclosed in Japanese Unexamined Laid Open Patent Application H08 (1996)-181313 is manufactured through the following steps. First, trenches are formed in a semiconductor substrate. Then, a drain region is formed in the bottom portion of the trench. Then, a drift region is formed around the trench with an oxide film interposed therebetween. Then, a base region is formed in the surface portion of the semiconductor chip such that the base region is spaced apart from the trench. Then, an emitter region is formed in the surface portion of the base region. Then, a gate oxide film is formed on the extended portion of the base region extended between the emitter region and the drift region. Finally, a gate electrode is formed on the gate oxide film. The gate oxide film formed on the semiconductor chip is very uniform and very reliable. By forming the drain region in the bottom portion of the trench, the unit cell size, the ON-resistance, and the tradeoff relation between the breakdown voltage and the ON-resistance are reduced.

Japanese Examined Patent Application S62 (1987)-41428 discloses a lateral MISFET, which includes a drain region, a lightly doped offset gate region contacting the drain region, a base region, a source region, a gate electrode formed above the extended portion of the base region extended between the source region and the offset gate region with a gate insulation film interposed therebetween, a source electrode connected electrically to the source region, and a heavily doped buried region. One end of the heavily doped buried region is connected electrically to the source electrode, and the conductivity type thereof is opposite to the conductivity type of the drain region. The heavily doped buried region surrounds the source region below the source electrode and the other end of the heavily doped buried region extends to the vicinity of the region beneath the edge of the offset gate region. This structure prevents the switch back phenomena. In the switch back phenomena, the resistance becomes negative in the region (in which the current rises sharply) of the breakdown voltage characteristics, the breakdown voltage lowers sharply, and the drain current increases sharply.

The lateral MISFET disclosed in Japanese Examined Patent Application S63 (1988)-46992 includes offset gate regions formed by the self-alignment technique using a gate electrode as a mask. An end of each offset gate region overlaps with either one of the ends of the gate electrode and the offset gate regions are connected electrically to a source region and a drain region. This structure realizes a high breakdown voltage and a high-density circuit integration.

Since the foregoing drift region is formed usually by diffusion, the donors and the acceptors compensate each other and the effective impurity concentration (the net impurity concentration) becomes low in the boundary between the base region and the drift region. As the overlapping area between the gate electrode and the drift region becomes narrower, only the lightly doped portion of the drift region remains finally overlapping with the gate electrode, and the drift resistance of the lightly doped portion becomes high, causing high ON-resistance. If the patterns are not positioned precisely, the drift region and the gate electrode will not overlap each other, the channel and the drift region will be disconnected, and no electrical conduction will be obtained in some cases.

Accordingly, there remains a need to obviate the problems described above to form MIS-type semiconductor devices exhibiting low ON-resistance and high-speed switching capability. The present invention addresses this need.

SUMMARY OF THE INVENTION

The present invention relates to MIS-type semiconductor devices having a metal-insulation film-semiconductor structure (a MIS structure), such as power MOSFETs, that can exhibit low ON-resistance and high-speed switching capability.

The MIS-type semiconductor device can include a source region of a first conductivity type, a base region of a second conductivity type, a drift region of the first conductivity type, a gate insulation film on the base region, and a gate electrode on the gate insulation film.

According to one aspect of the present invention, a source electrode is connected electrically to the source region, an insulation film is on the drift region and adjacent to the gate electrode, and a field plate is on the insulation film. The field plate is connected to the source electrode.

According to another aspect of the present invention, the gate insulation film is on the base region between the source region and the drift region, and the base region in contact with the gate insulation film has an impurity concentration peak positioned more closely to the drift region than to the source region.

According to another aspect of the present invention, a heavily doped region of the second conductivity type is in the base region below the gate electrode. The heavily doped region is positioned between the source region and the drift region to enable a depletion layer expanding from the drift region into the base region reach the heavily doped region.

The above described semiconductor devices can further include the following features:

The edge of the heavily doped region can be spaced apart 2.5 μm or narrower from the gate insulation film and 5.6 μm or narrower from the drift region. The edge of the heavily doped region can be spaced apart for 1 μm or narrower from the gate insulation film.

The device can further include an interlayer insulation film insulating the gate electrode and the source electrode from each other, with the insulation film is thinner than the interlayer insulation film. The insulation film can be as thin as or thicker than the gate insulation film and as thick as or thinner than Vb/Ec, where Vb is the breakdown voltage of the MIS-type semiconductor device and Ec ($5\times10^5$ (V/cm)) is the critical dielectric breakdown strength of silicon.

According to another aspect of the present invention (as well as for the above described devices), the drift region can be comprised of a first drift region and a second drift region, with the first drift region doped heavier than the second drift region. At least a part of the surfaces of the first drift region and the gate electrode overlap each other, and the edge of the second drift region is positioned farther from the gate electrode than the first drift region so that the second drift region is not exposed to the surface of the base region beneath the gate electrode.

The second drift region can be larger in volume than the first drift region. The diffusion depth of the second drift region can be longer than the diffusion depth of the first drift region. The net impurity amount per a unit length in the second drift region can be larger than the net impurity amount per a unit length in the first drift region.

The device can further including a semiconductor chip having a first major surface and a second major surface facing opposite to each other, and a drain region of the first conductivity type connected to the drift region. The source region, the base region, and the drift region are on the side of the first major surface, and the drift region is spaced from the source region.

The drain region can be on the side of the second major surface. In another embodiment, a trench is formed through the source region down to the base region, the gate electrode is in the trench or on the side wall of the trench with the gate insulation film interposed between the gate electrode and the trench, the drift region is in contact with the bottom of the trench, the drift region is below the gate electrode so that the drift region overlaps with the gate electrode in the projection perpendicular to the second major surface.

The other features described previously can also be included.

BRIEF DESCRIPTION OF THE DRAWINGS

FIG. 1(*b*) is a cross sectional view taken along line I(b)-I(b) of FIG. 1(*a*).

FIG. 2(*b*) is an impurity distribution profile in the cross section taken along line II(a)-II(b) of FIG. 1(*b*).

DETAILED DESCRIPTION

Now the invention will be described in detail hereinafter with reference to the accompanied drawing figures, which illustrate the preferred embodiments of the invention. In the following descriptions, the n-type layer or the n-type region is a layer or a region, where electrons are majority carriers therein. The p-type layer or the p-type region is a layer or a region, where holes are majority carriers therein. The suffix "+" on the right shoulder of the letter "n" or "p" indicating the conductivity type of the layer or the region indicates that the layer or the region is doped relatively heavily. The suffix "−" on the right shoulder of the letter "n" or "p" indicating the conductivity type of the layer or the region indicates that the layer or the region is doped relatively lightly. Although the first conductivity type is an n-type and the second conductivity type is a p-type in the embodiments described below, the invention is applicable also to the semiconductor devices, in which the first conductivity type is a p-type and the second conductivity type is an n-type.

Figure 1A:
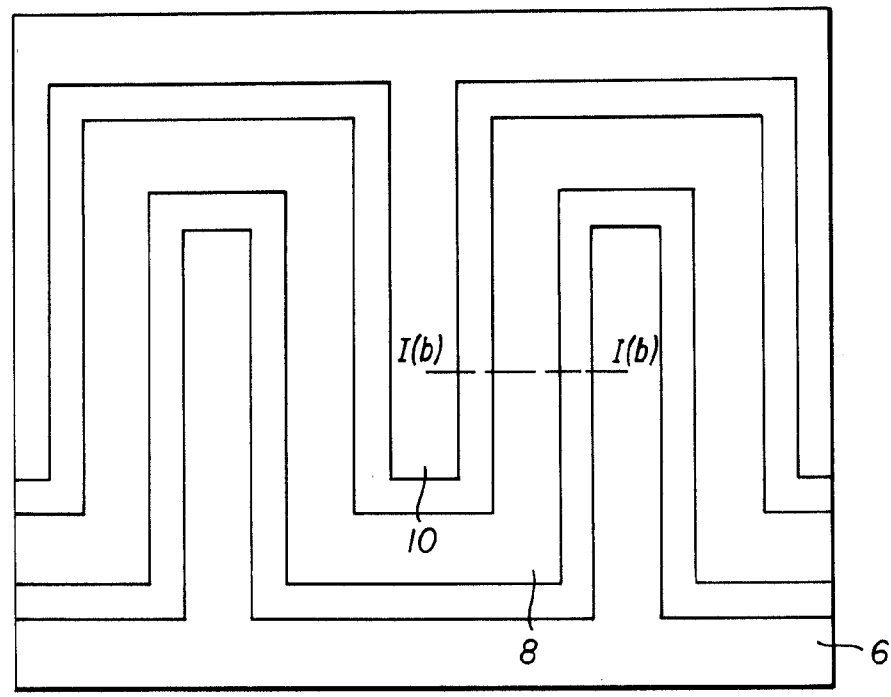
FIG. 1(*a*) is a top plan view of a first embodiment of a MIS-type semiconductor device according to the present invention.
Figure 1B:
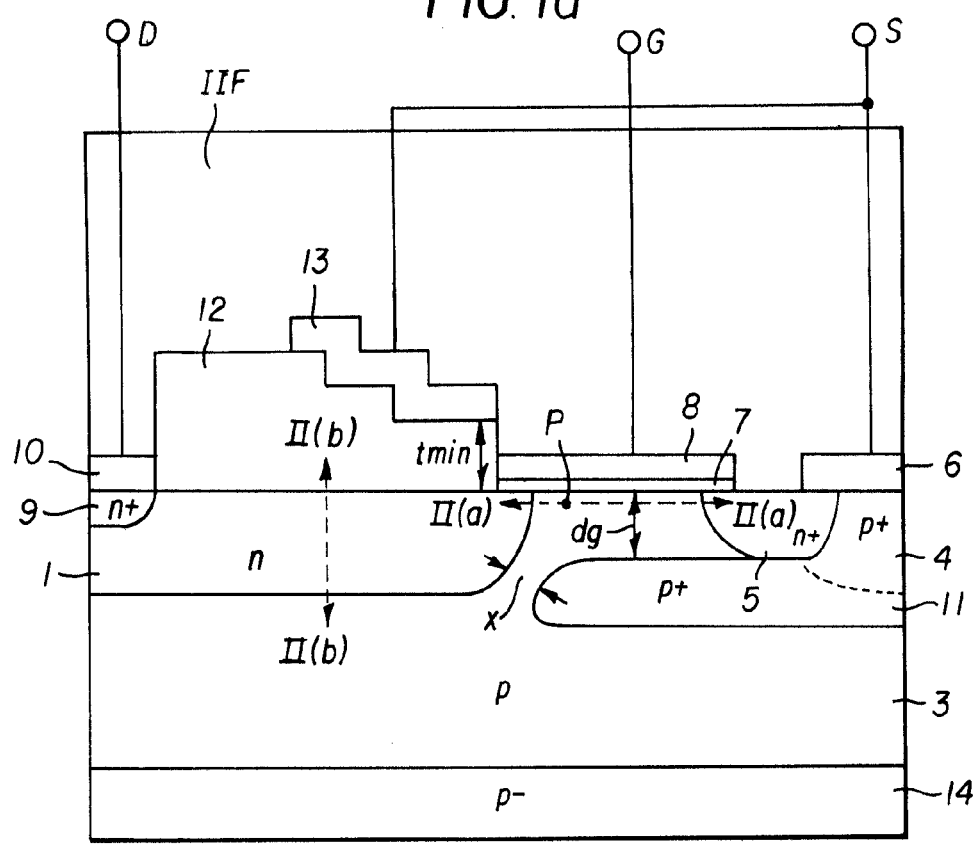
Figure 2A:
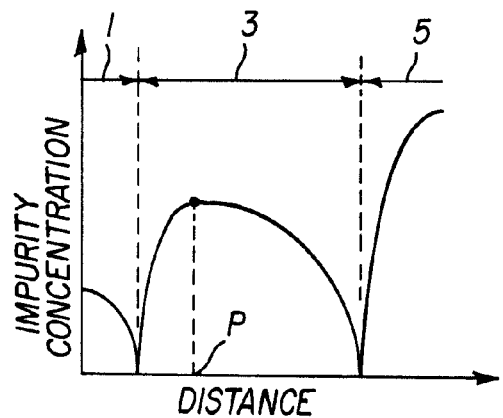
FIG. 2(*a*) is an impurity distribution profile in the cross section taken along line II(a)-II(a) of FIG. 1(*b*).

FIG. 1(a) is a top plan view of a first embodiment of a MIS-type semiconductor device according to the present invention. FIG. 1(b) is a cross sectional view taken along line I(b)-I(b) of FIG. 1(a). The MIS-type semiconductor device shown in these figures is a lateral planar MOSFET, half the unit cell thereof is shown in FIG. 1(b). The lateral planar MOSFET shown in FIGS. 1(a) and 1(b) is manufactured in the following way. A p-type layer is formed by epitaxial growth on a p$^-$-type substrate 14. A p$^+$-type diffusion region is formed in the surface portion of the p-type layer and a p-type layer is formed again on the p$^+$-type diffusion region such that a p$^+$-type stopper region 11, which is a buried layer, is formed inside a p-type base region 3. A gate insulation film 7 is formed on the p-type base region 3. A gate electrode 8 is formed on the gate insulation film 7. An n-type drift region 1 and an n$^+$-type source region 5 are formed using the gate electrode 8 as a mask. An n$^+$-type drain region 9 is formed in the surface portion of the n-type drift region 1. A p$^+$-type contact region 4 is formed in the surface portion of the p-type base region 3. The n$^+$-type source region 5 is formed by deeply diffusing phosphorus ions, the diffusion coefficient thereof being large, at a low concentration and, then, by shallowly diffusing arsenic ions, the diffusion coefficient thereof becomes small. The n$^+$-type source region 5 is formed as described above to dope the portion of the p-type base region 3 below the gate insulation film 7 with phosphorus ions so that the impurity concentration peak P in the portion of the p-type base region 3 below the gate insulation film 7 can be positioned more closely to the n-type drift region 1 than to the source region 5 as shown in FIG. 2(a), which is an impurity distribution profile in the cross section taken along line II(a)-II(a) of FIG. 1(b).

An insulation film such as an oxide film 12 is formed on the portion of the n-type drift region 1 between the gate electrode 8 and the n$^+$-type drain region 9 such that the oxide film 12 is thinner on the side of the gate electrode 8 and thicker on the side of the n$^+$-type drain region 9. A field plate 13 is formed on the oxide film 12. A drain electrode 10 is formed on the n$^+$-type drain region 9. A source electrode 6 is formed on the n$^+$-type source region 5 and the p$^+$-type contact region 4. The source electrode 6 and the field plate 13 are connected electrically to each other. An interlayer insulation film IIF is formed between the gate electrode 8 and the source electrode 6 to insulate the gate electrode 8 and the source electrode 6 from each other. The oxide film 12 is thinner than the interlayer insulation film.

The spacing dg between the gate insulation film 7 and the p$^+$-type stopper region 11 is set to be 2.5 μm or narrower and, preferably 1 μm or narrower. The minimum spacing x between the n-type drift region 1 and the p$^+$-type stopper region 11 is set to be 5.6 μm or narrower. The thinner portion of the oxide film 12 near the gate electrode 8 is set to be as thin as or thicker than gate insulation film 7 and as thick as or thinner than Vb/Ec, wherein Vb is the breakdown voltage (V) of the device and Ec the critical dielectric breakdown strength (V/cm) of silicon. For example, when the breakdown voltage of the device is 30 V, the thinner portion of oxide film 12 is set to be 0.6 μm or less in thickness. It is preferable that the position of the peak impurity concentration P in the boundary portion of the p-type base region 3 in contact with the gate insulation film 7 is located more closely to the n-type drift region 1 than to source region 5.

As the spacing dg between the gate insulation film 7 and the p$^+$-type stopper region 11 exceeds 2.5 μm to the wider side, the depletion layer expands deep into the portion of the p-type base region 3 below the gate electrode 8, causing large feedback capacitance. As the spacing dg is narrower, it is more difficult for the depletion layer to expand into the portion of the p-type base region 3 below the gate electrode 8, resulting in smaller feedback capacitance. Therefore, a narrower spacing dg is more preferable. Preferably, the spacing dg is 1 μm or narrower for the device when the breakdown voltage thereof is 30 V. These relations will be described more in detail below.

Figure 11:
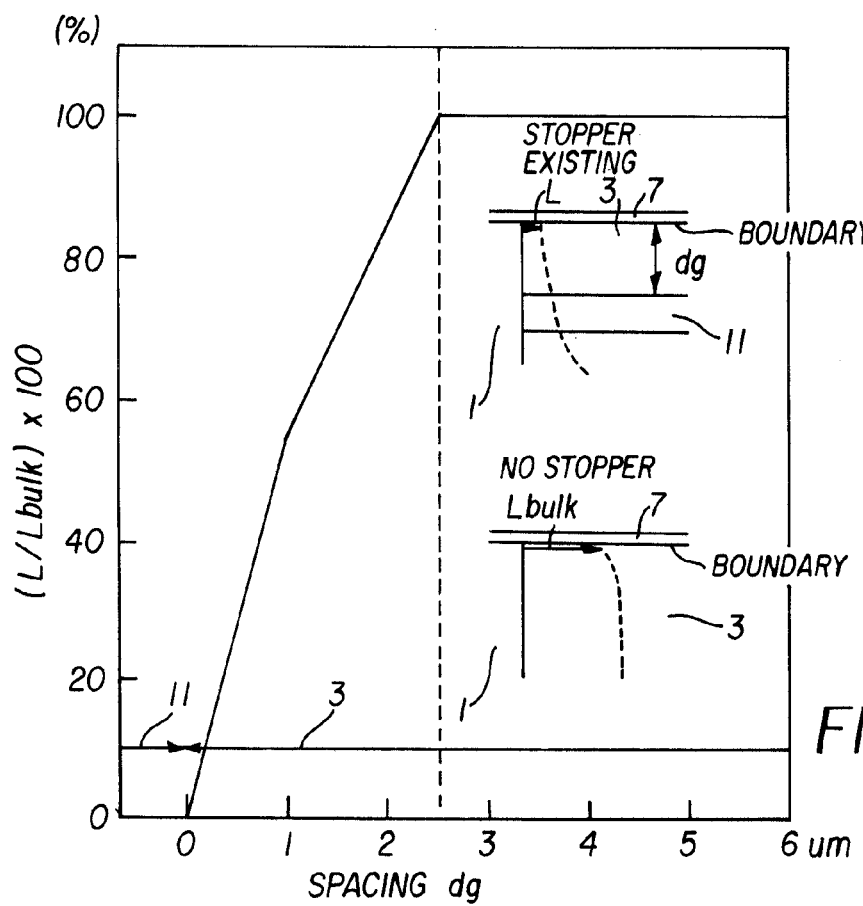
FIG. 11 shows a curve relating the spacing dg and the ratio L/Lbulk×100 (%) of the depletion layer expansion length L under the existence of a depletion layer stopper to the depletion layer expansion length Lbulk under the nonexistence of the depletion layer stopper with each other.

FIG. 11 shows a curve relating the spacing dg and L/Lbulk×100 (%) with each other. The spacing dg is the spacing between the p$^+$-type stopper region 11 and the gate insulation film 7. The numerator L represents the expansion length of the depletion layer in the boundary portion of the p-type base region 3 in contact with the gate insulation film 7, namely the distance between the equipotential curve of 0 V and the n-type drift region 1, in the device including the p$^+$-type stopper region 11 spaced apart by dg from the gate insulation film 7. The denominator Lbulk represents the expansion length of the depletion layer in the boundary portion of the p-type base region 3 in contact with the gate insulation film 7, namely the distance between the equipotential curve of 0 V and the n-type drift region 1, in the device not including any p$^+$-type stopper region. The expansion lengths L and Lbulk are compared at the same bias voltage. The ratio L/Lbulk×100% of 100% indicates that the depletion layer expansion is not affected by the p$^+$-type stopper region 11. As the depletion layer expansion length L becomes longer, the feedback capacitance becomes larger.

FIG. 11 relates the spacing dg and L/Lbulk×100 (%) with each other for the device, in which the impurity concentration in the p$^+$-type stopper region 11 is 1×10$^{21}$ cm$^{-3}$, the impurity concentration in the p-type base region 3 is 1×10$^{15}$ cm$^{-3}$, the impurity concentration in the n-type drift region 1 is 1×10$^{19}$ cm$^{-3}$, and the p$^+$-type stopper region 11 is in contact with the n-type drift region 1. Since the depletion layer expansion is not affected by the p$^+$-type stopper region 11 as described in FIG. 11 when the spacing dg is 2.5 μm or wider, it is not necessary to set the spacing dg to be wider than 2.5 μm. Since the spacing dg, at which depletion layer expansion is not affected by the p$^+$-type stopper region 11 is around 1 μm in the device and the breakdown voltage thereof is 30 V, it is not necessary to set the spacing dg to be wider than 1.0 μm.

Figure 12:
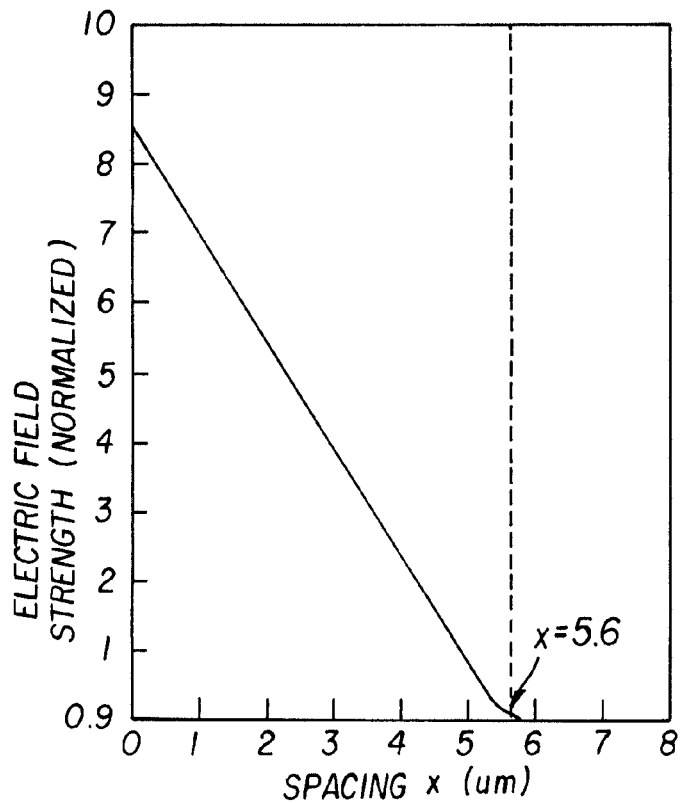
FIG. 12 shows a curve relating the spacing dg and the electric field strength with each other.

When the impurity concentration in the p-type base region 3 is set to be 1×10$^{15}$ cm$^{-3}$ and the impurity concentration in the n-type drift region 1 to be extremely high 1×10$^{19}$ cm$^{-3}$, the depletion layer expanding from the edge of the n-type drift region 1 into the p-type base region 3 does not reach the p$^+$-type stopper region 11 when the spacing x between the n-type drift region 1 and the p$^+$-type stopper region 11 is wider than 5.6 μm as indicated by the electric field strength in FIG. 12. Since the impurity concentration in the n-type drift region 1 is usually low, the depletion layer expands also into the n-type drift region 1 and the depletion layer expanding into p-type base region 3 becoming narrow. Therefore, it is preferable to set the spacing x to be 5.6 μm or narrower. As the spacing x is narrower, it is more difficult for the depletion layer to expand into the portion of the p-type base region 3 below gate electrode 8. Therefore, it is preferable that the n-type drift region 1 and the p$^+$-type stopper region 11 are in contact with each other, since the feedback capacitance is the smallest in this state.

It is preferable to set the minimum thickness tmin of the oxide film 12 on the side of the gate electrode 8 to be thick as or thicker than the thickness of the gate insulation film 7, since the breakdown voltage of the device becomes lower than the gate breakdown voltage. It is preferable to set the minimum thickness tmin of the oxide film 12 on the side of gate electrode 8 to be less than or equal to Vb/Ec, since the minimum thickness tmin is so thick that the field plate effect of the oxide film 12 is weakened.

If the impurity concentration peak P in the boundary portion of the p-type base region 3 in contact with the gate insulation film 7 is located more closely to the n-type source region 5, the depletion layer expanding from the n-type drift region 1 into the boundary portion of the p-type base region 3 in contact with the gate insulation film 7 will expand to the side of the n-type source region 5, causing large feedback capacitance. Therefore, it is better to locate the impurity concentration peak P more closely to the n-type drift region 1.

The p$^+$-type stopper region (depletion layer stopper) 11 is disposed below the gate electrode 8 to prevent the depletion layer from expanding. In the cross section taken along line II(a)-II(a) (hereafter referred to in the figures as section A-A) across the surface portion of the p-type base region 3, in which the channel is formed, the impurity concentration distributes as described in FIG. 2(*a*). Here, the maximum impurity concentration (the position of the impurity concentration peak) is located more closely to the n-type drift region 1 than to the n$^+$-type source region 5. In the following embodiments of the invention, the impurity distribution profiles in the respective A-Across sections are similar to that described in FIG. 2(*a*).

By adjusting the impurity distribution profile as described above, the threshold gate voltage is controlled and the depletion layer is prevented from expanding below the gate electrode 8. Moreover, the field plate 13 is disposed above the n-type drift region 1 with the oxide film 12 interposed therebetween and biased at the source potential. By thinning the oxide film 12 in the vicinity of the gate electrode 8, the depletion layer is prevented from expanding by the source potential of the field plate 13. Thus, the electric field in the vicinity of the gate insulation film 7 is relaxed and a certain breakdown voltage is secured.

Figure 2B:
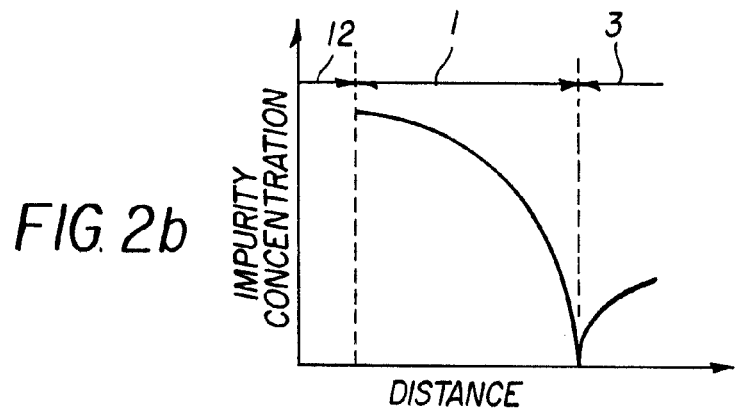

By setting the impurity distribution in the II(b)-II(b) cross section of the n-type drift region 1 in FIG. 1(*b*) to be higher on the side of the surface thereof as described in FIG. 2(*b*), the ON-resistance is reduced. The surface impurity concentration in the n-type drift region 1 is set to be high by implanting impurity ions once into the surface portion of the semiconductor chip and by thermally driving the implanted impurity atoms.

By securing a sufficient overlapping area between the gate electrode 8 and the n-type drift region 1 and by setting the surface impurity concentration in the n-type drift region 1 to be high, low ON-resistance is realized. By positioning the $p^+$-type stopper region 11 in the predetermined location, depletion layer expansion into the portion of the p-type base region 3 below the gate electrode 8 is prevented from occurring and low feedback capacitance is realized. By reducing the feedback capacitance, the switching loss is reduced.

It is not always necessary to connect the $p^+$-type stopper region 11 to the $p^+$-type contact region 4. Alternatively, the $p^+$-type stopper region 11 can be shaped as an island and positioned at the midpoint between the n-type drift region 1 and the $n^+$-type source region 5 so that the depletion layer expanding from the n-type drift region 1 can reach the $p^+$-type stopper region 11. Still alternatively, the $p^+$-type stopper region 11 can be extended below the n-type drift region 1.

Although the MIS-type semiconductor device according to the first embodiment of the invention has been described in connection with the structure that has all the specific features of the $p^+$-type stopper region 11, the field plate 13, and the impurity concentration peak P, it is not always necessary for the MIS-type semiconductor device according to the invention to have all these specific features. In other words, the MIS-type semiconductor devices according to the following embodiments can have any of the specific features of the $p^+$-type stopper region 11, the field plate 13, and the impurity concentration peak P.

Figure 3:
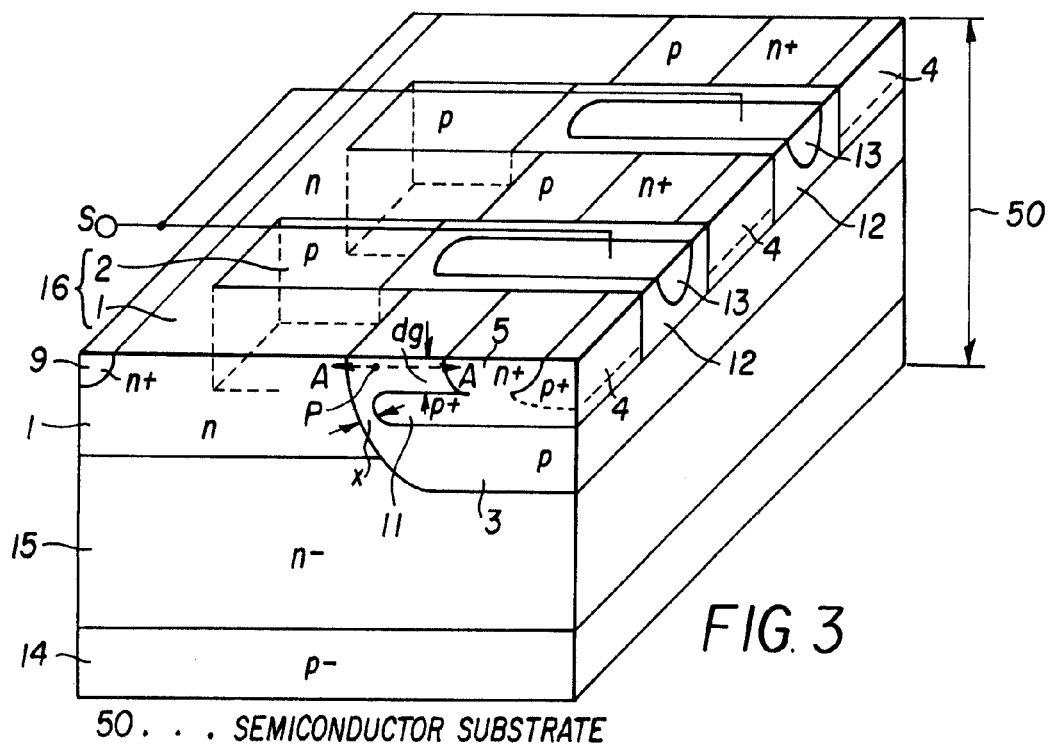
FIG. 3 is a perspective view of a second embodiment of a MIS-type semiconductor device according to the present invention.

FIG. 3 is a perspective view of a second embodiment of a MIS-type semiconductor device according to the present invention. FIG. 3 shows half the unit cell in a lateral planar MOSFET. Here, the MIS-type semiconductor device has a MOSFET structure essentially the same as the MOSFET structure in the first embodiment in that it includes an n-type drift region 1, a p-type base region 3, a $p^+$-type contact region 4, an $n^+$-type source region 5, an $n^+$-type drain region 9, a source electrode 6, a gate insulation film 7, a gate electrode 8, an oxide film 12, and a field plate 13. In FIG. 3, the source electrode 6, the gate insulation film 7, and the gate electrode 8 are not shown, and only a part of the oxide film 12 (oxide film 12 in FIG. 1(b)), and a part of the field plate 13 (field plate 13 in FIG. 1(b)) are shown. The MIS-type semiconductor device according to the second embodiment is different from the MIS semiconductor device according to the first embodiment in that the field plate 13 is not only disposed on a semiconductor chip 50 but also buried in semiconductor chip 50. Further, the second embodiment, includes an alternating conductivity type layer 16 consisting of the comb-tooth portions of the n-type drift region 1 and the p-type partition regions 2 arranged alternately in the lengthwise direction (the direction along which the $n^+$-type source region 5 or the $n^+$-type drain region 9 extends) of FIG. 3. Thus, the field plate 13 need not be on the semiconductor chip 50. The field plate 13 can be in close proximity to the sidewall of the n-type drift region 1 with no problem. If the buried portion of the field plate 13 and the partition region 2 are aligned on the same line as shown in FIG. 3, the current path will not be interrupted by the field plate 13 that is an electrically nonconductive region buried in the semiconductor chip 50, since the ON-current does not flow through partition region 2.

By setting the spacing dg, the spacing x, the position P of the impurity concentration peak, and the minimum film thickness tmin as in the first embodiment, the same effects can be obtained in the second embodiment.

Figure 4:
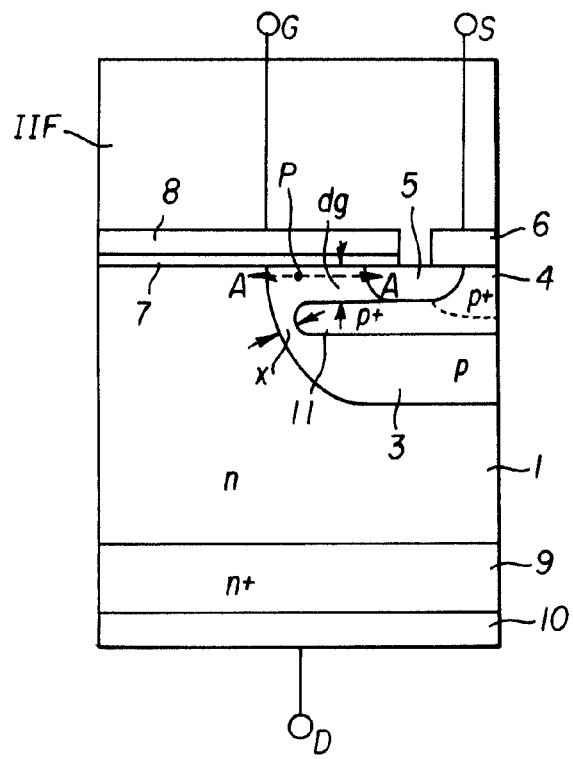
FIG. 4 is a cross sectional view of a third embodiment of a MIS-type semiconductor device according to the present invention.

FIG. 4 is a cross sectional view of a third embodiment of a MIS-type semiconductor device according to the present invention. FIG. 4 shows half the unit cell in a vertical planar MOSFET. Here, the MIS-type semiconductor device is similar to the first embodiment in that it also includes a $p^+$-type stopper region 11 to prevent the depletion layer from expanding into the portion of the p-type base region 3 below the gate electrode 8. The impurity concentration maximum in the surface portion of the p-type base region 3, in which a channel is formed, is positioned more closely to the n-type drift region 1 than to the $n^+$-type source region 5 so that the gate threshold voltage can be controlled and the depletion layer can be prevented from expanding. By setting the spacing dg, the spacing x, and the position P of the impurity concentration peak as in the first embodiment, the same effects can be obtained in the third embodiment.

Figure 5:
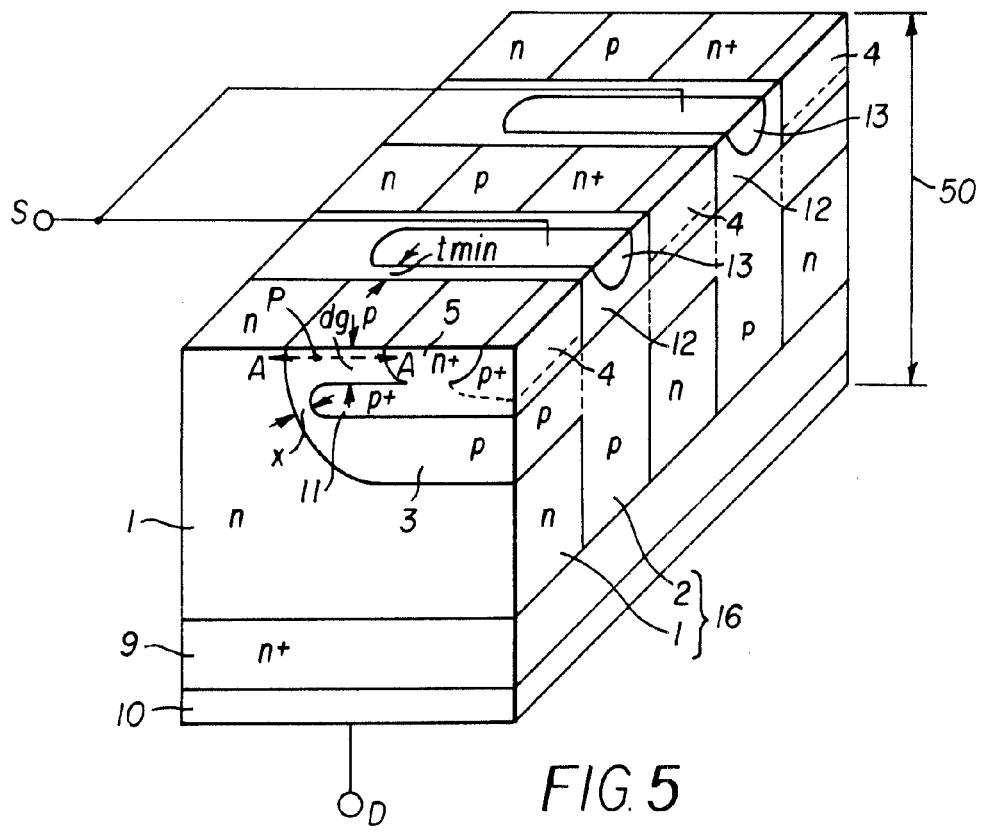
FIG. 5 is a perspective view of a fourth embodiment of a MIS-type semiconductor device according to the present invention.

FIG. 5 is a perspective view of a fourth embodiment of a MIS-type semiconductor device according to a fourth embodiment of the invention. FIG. 5 shows half the unit cell in a vertical planar MOSFET. In the same manner as in the lateral planar MOSFET according to the second embodiment, the vertical planar MOSFET according to the fourth embodiment includes a field plate 13 buried in the semiconductor chip 50 and an alternating conductivity layer. By setting the spacing dg, the spacing x, the position P of the impurity concentration peak, and the minimum film thickness tmin as in the first embodiment, the same effects can be obtained in the fourth embodiment.

Figure 6:
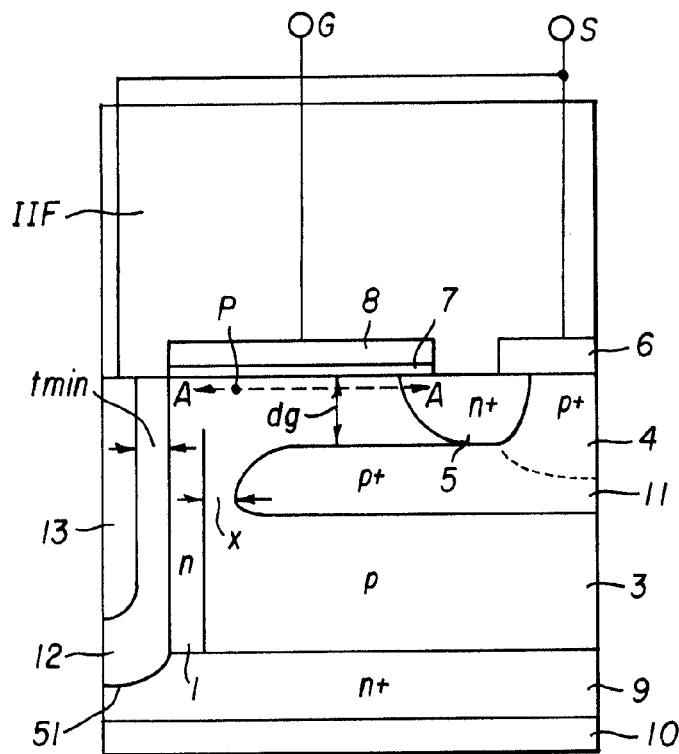
FIG. 6 is a cross sectional view of a fifth embodiment of a MIS-type semiconductor device according the present invention.

FIG. 6 is a cross sectional view of a fifth embodiment of a MIS-type semiconductor device according to the present invention. FIG. 6 shows half the unit cell in a vertical planar MOSFET. Here, the vertical planar MOSFET includes an n-type drift region 1 like a plug (that is an electrical conductor extended from the surface of the semiconductor chip to an $n^+$-type drain region 9 formed in the bottom portion of the semiconductor chip). In the structure shown in FIG. 6, a field plate 13 is formed in a trench 51 adjoining the n-type drift region 1 with an oxide film 12 interposed between the field plate 13 and the n-type drift region 1. By setting the spacing dg, the spacing x, the position P of the impurity concentration peak, and the minimum film thickness tmin as in the first embodiment, the same effects can be obtained in the fifth embodiment.

Figure 7:
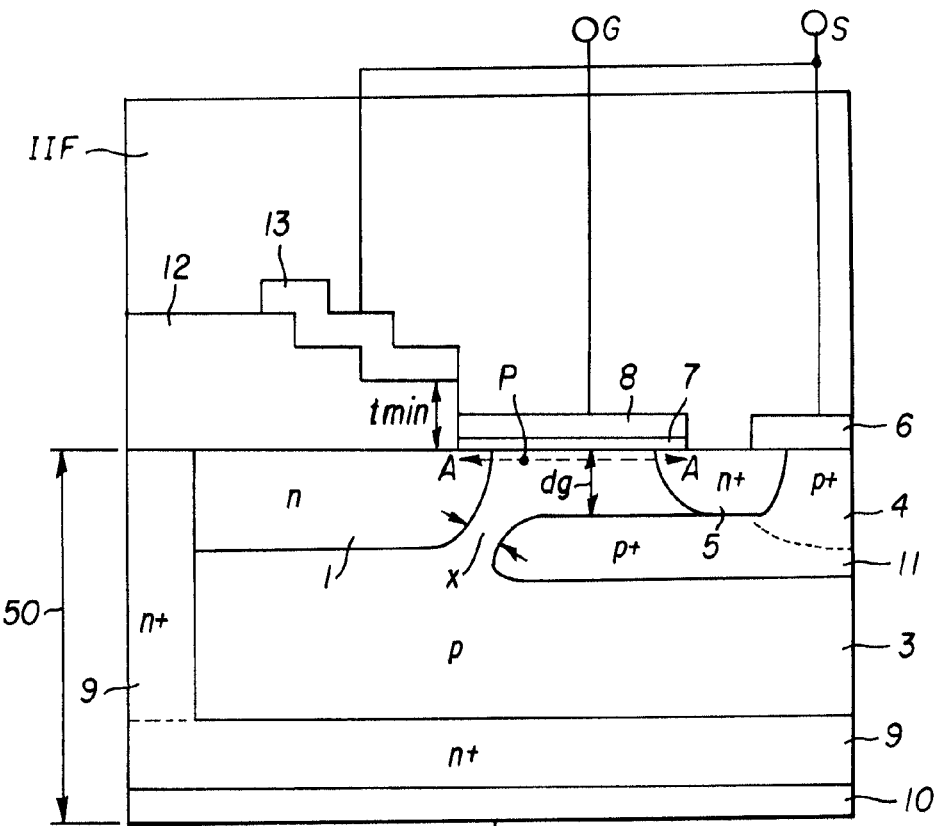
FIG. 7 is a cross sectional view of a sixth embodiment of a MIS-type semiconductor device according to the present invention.

FIG. 7 is a cross sectional view of a sixth embodiment of a MIS-type semiconductor device according to the present invention. FIG. 7 shows half the unit cell in a vertical planar MOSFET. Here, the vertical planar MOSFET includes an n-type drift region 1 in the surface portion of a semiconductor chip 50 and an $n^+$-type drain region 9 formed like a plug. By setting the spacing dg, the spacing x, the position P of the impurity concentration peak, and the minimum film thickness tmin as in the first embodiment, the same effects can be obtained in the sixth embodiment.

Figure 8:
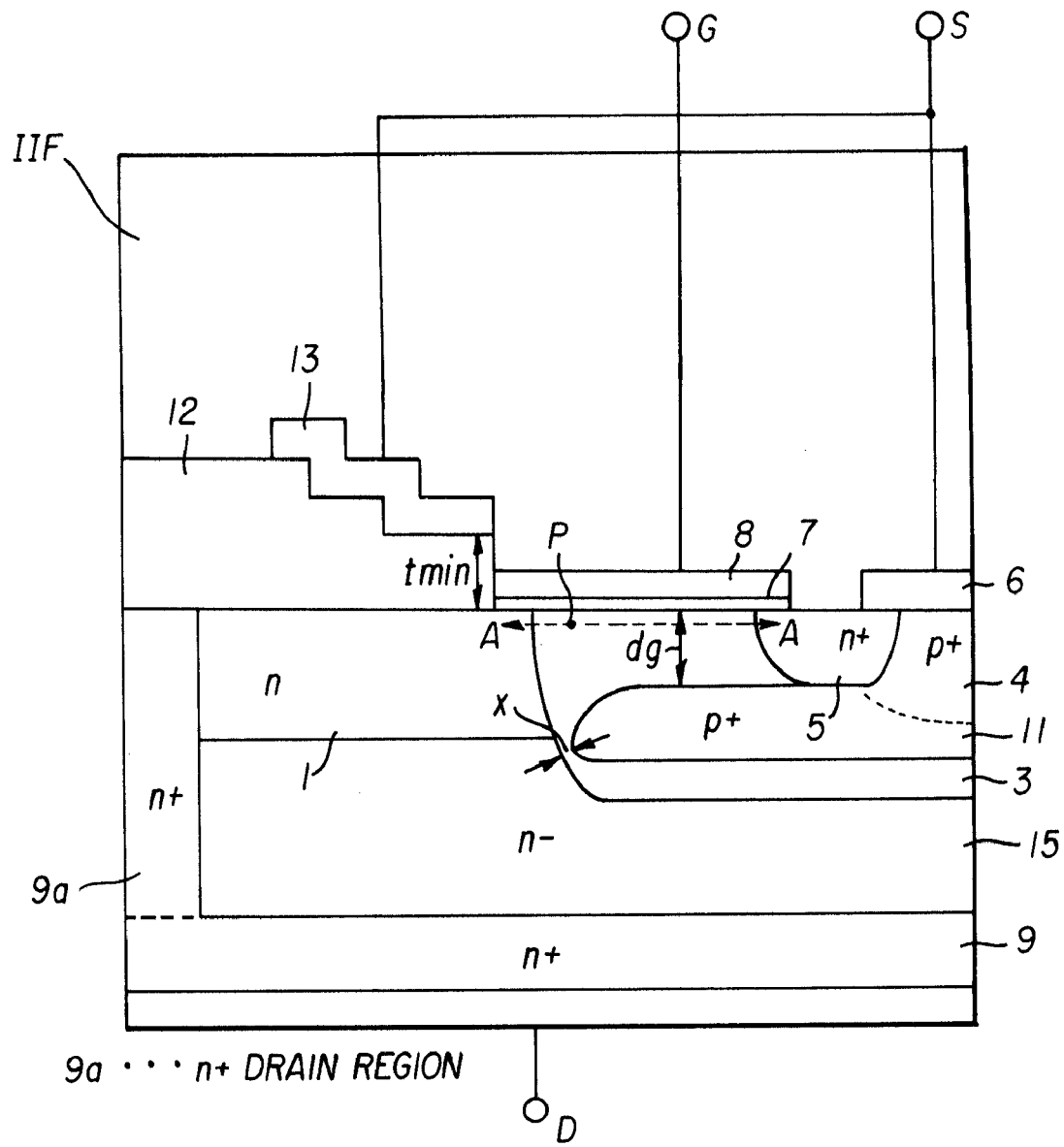
FIG. 8 is a cross sectional view of a seventh embodiment of a MIS-type semiconductor device according to the present invention.

FIG. 8 is a cross sectional view of a seventh embodiment of a MIS-type semiconductor device according to the present invention. FIG. 8 shows half the unit cell in a vertical planar MOSFET. Here, the MIS-type semiconductor device includes an $n^+$-type drain region 9a formed like a plug in the same manner as $n^+$-type drain region 9 in the MIS-type semiconductor device according to the sixth embodiment. By heavily doping the surface portion of the n-type drift region 1 near the field plate 13 in the structure shown in FIG. 8, the ON-resistance is effectively reduced. The seventh embodiment also includes an $n^-$-type layer 15 that facilitates to expand the depletion layer and secure a certain breakdown voltage.

By setting the spacing dg, the spacing x, the position P of the impurity concentration peak, and the minimum film thickness tmin as in the first embodiment, the same effects can be obtained in the seventh embodiment.

Figure 9:
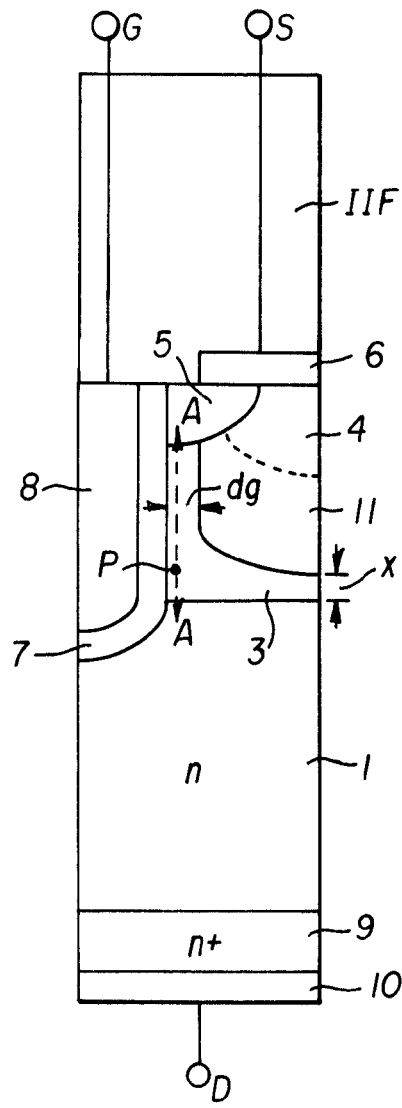
FIG. 9 is a cross sectional view of an eight embodiment of a MIS-type semiconductor device according to the present invention.

FIG. 9 is a cross sectional view of a eighth embodiment of a MIS-type semiconductor device according to the present invention. FIG. 9 shows half the unit cell in a vertical trench MOSFET. Here, the vertical trench MOSFET does not include any field plate. By setting the spacing dg, the spacing x, and the position P of the impurity concentration peak as in the first embodiment, the same effects can be obtained in the eighth embodiment.

Figure 10:
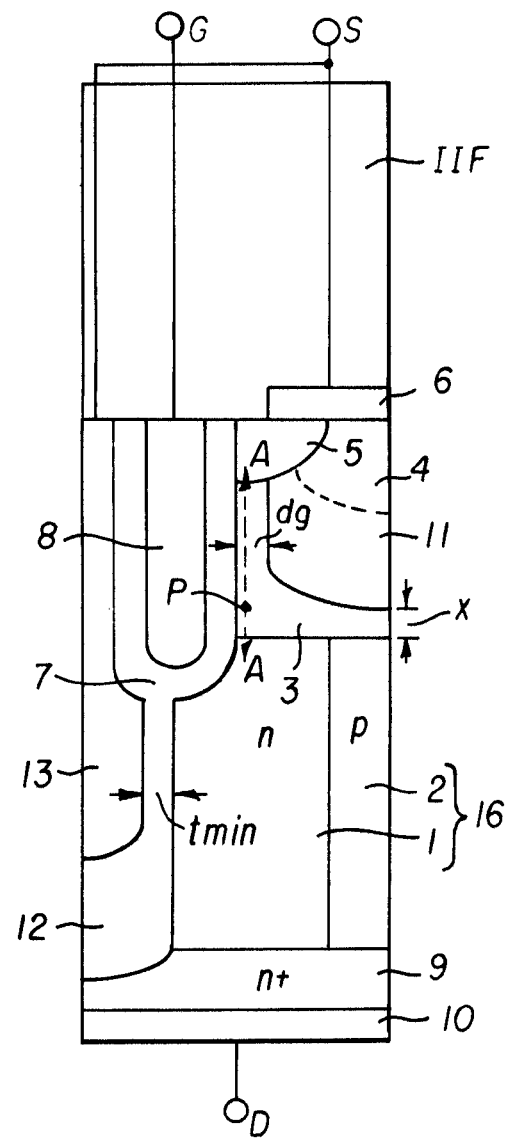
FIG. 10 is a cross sectional view of a ninth embodiment of a MIS-type semiconductor device according to the present invention.

FIG. 10 is a cross sectional view of a ninth embodiment of a MIS-type semiconductor device according to the present invention. FIG. 10 shows half the unit cell in a vertical trench MOSFET. Here, the MIS-type semiconductor device includes a trench formed more deeply than the gate thereof and a field plate 13 formed in the trench. The MIS-type semiconductor device shown in FIG. 10 is a super-junction semiconductor device including an alternating conductivity type layer consisting of n-type drift regions 1 and p-type partition regions 2 arranged alternately. Alternatively, the MIS-type semiconductor device according to the ninth embodiment can include only one n-type drift region 1 (but not any p-type partition region 2) in the same manner as the MIS-type semiconductor device according to the eighth embodiment. By setting the spacing dg, the spacing x, the position P of the impurity concentration peak, and the minimum film thickness tmin as in the first embodiment, the same effects can be obtained in the ninth embodiment.

In the MIS-type semiconductor devices according to the foregoing embodiments, the effective (substantial) impurity concentration is low in the vicinity of the boundary between the base region and the drift region, since the donor ions and the acceptor ions compensate each other due to the thermal hysteresis, to which the MIS-type semiconductor devices have subjected intentionally or unintentionally in the manufacturing steps thereof.

Figure 13:
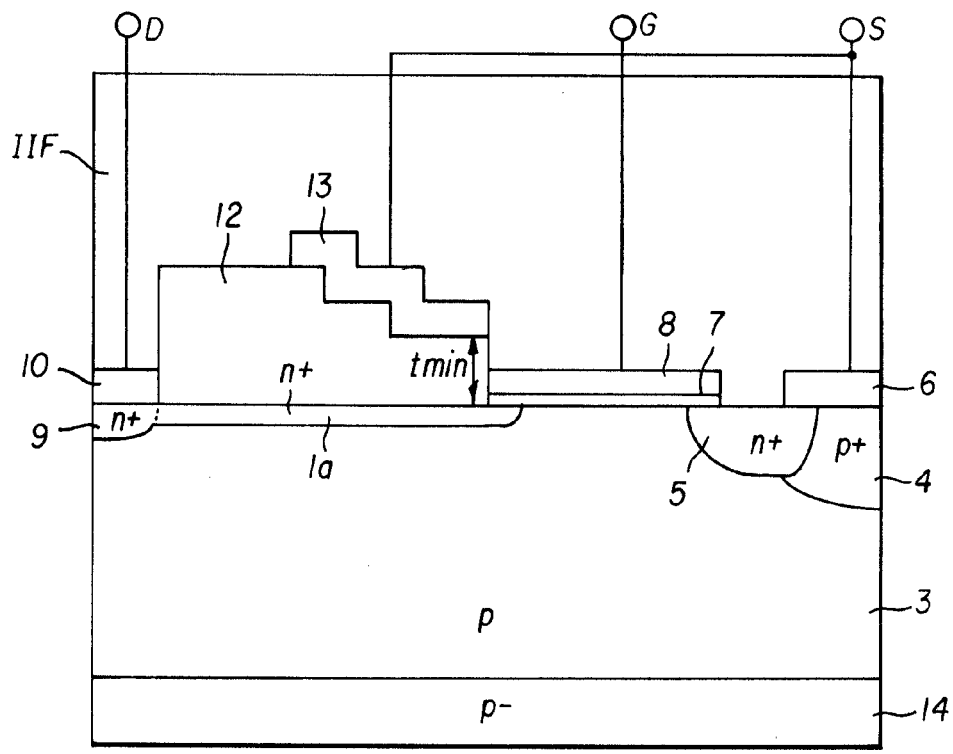
FIG. 13 is a cross sectional view of a MIS-type semiconductor device that includes a heavily doped drift region.

Therefore, as the overlapping area between the gate electrode and the drift region becomes narrower, only the resultant lightly doped portion of the drift region overlaps with the gate electrode. Since the drift resistance in the resultant lightly doped portion of the drift region is high, high ON-resistance is created. To keep the overlapping portion of the drift region at a sufficiently high effective impurity concentration while confining the overlap of the gate electrode and the drift region within a narrow area, it is ideal to suppress the diffusion in the boundary between the base region and the drift region at a level as low as possible so that the impurity concentration profile can change stepwise across the junction between the base region and the drift region. However, this way of doping the overlapping portion of the drift region as heavily as possible dopes the entire drift region heavily, resulting in a MIS-type semiconductor device that includes a heavily doped drift region (an $n^+$-type drift region $1a$) as shown in FIG. 13. Since the carrier mobility in the heavily doped drift region becomes low, the ON-resistance becomes high.

Figure 14:
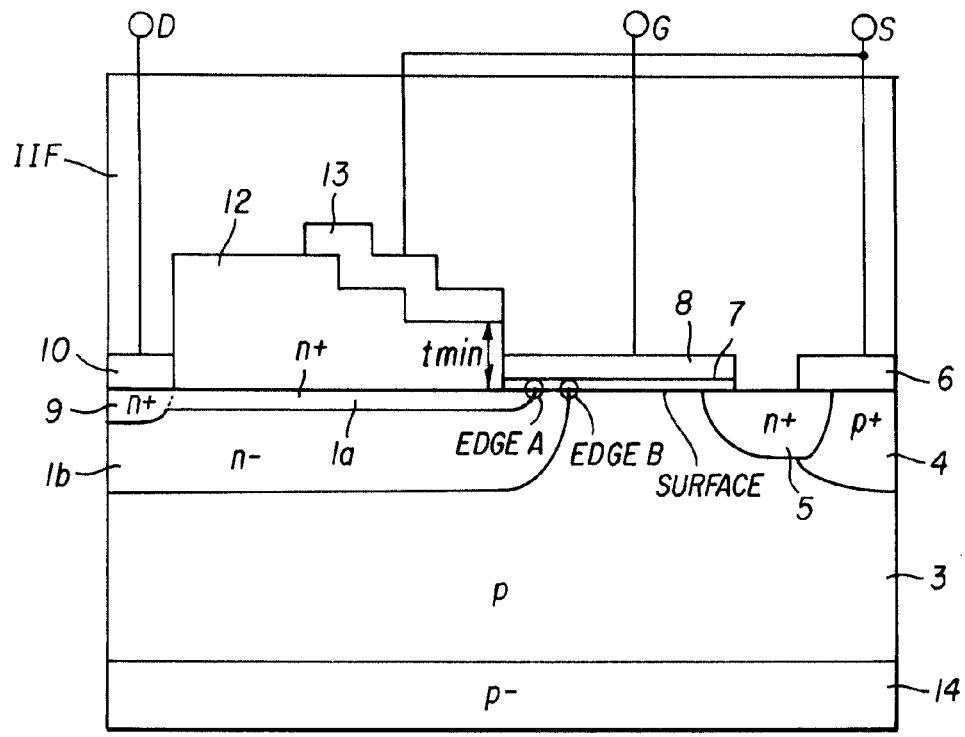
FIG. 14 is a cross sectional view of a MIS-type semiconductor device that includes a heavily doped drift region and a lightly doped drift region.

In the MIS-type semiconductor device, which includes a heavily doped drift region (an $n^+$-type drift region $1a$) and a lightly doped drift region (an $n^-$-type drift region $1b$), that is the so-called "LDD" as shown in FIG. 14, in which the net impurity concentration is low, the carrier mobility cannot be lowered by making the most part of the ON-current flow through $n^-$-type drift region $1b$. However, the edge B of $n^-$-type drift region $1b$ is positioned more closely to the surface portion of the semiconductor chip below the center of the gate electrode 8 than the edge A of the $n^+$-type drift region $1a$. In other words, the edge B of the $n^-$-type drift region $1b$ is exposed to the surface portion of a p-type base region 3 below the gate electrode 8. Therefore, widening the $n^-$-type drift region $1b$ causes, in contradiction to the original intention, high capacitance between the gate and drain (high feedback capacitance).

Some structures that minimize the overlapping area between the gate electrode and the drift region, keeping the impurity concentration in the overlapping portion of the drift region at a sufficiently high value, and preventing the carrier mobility in the entire drift region from lowering to obtain a MIS-type semiconductor device exhibiting low ON-resistance and low feedback capacitance will be described in connection with the following embodiments. The MIS-type semiconductor devices according to the following first six embodiments do not include any $p^+$-type stopper region 11. The MIS-type semiconductor device according to the following last one embodiment includes a $p^+$-type stopper region 11.

Figure 15:
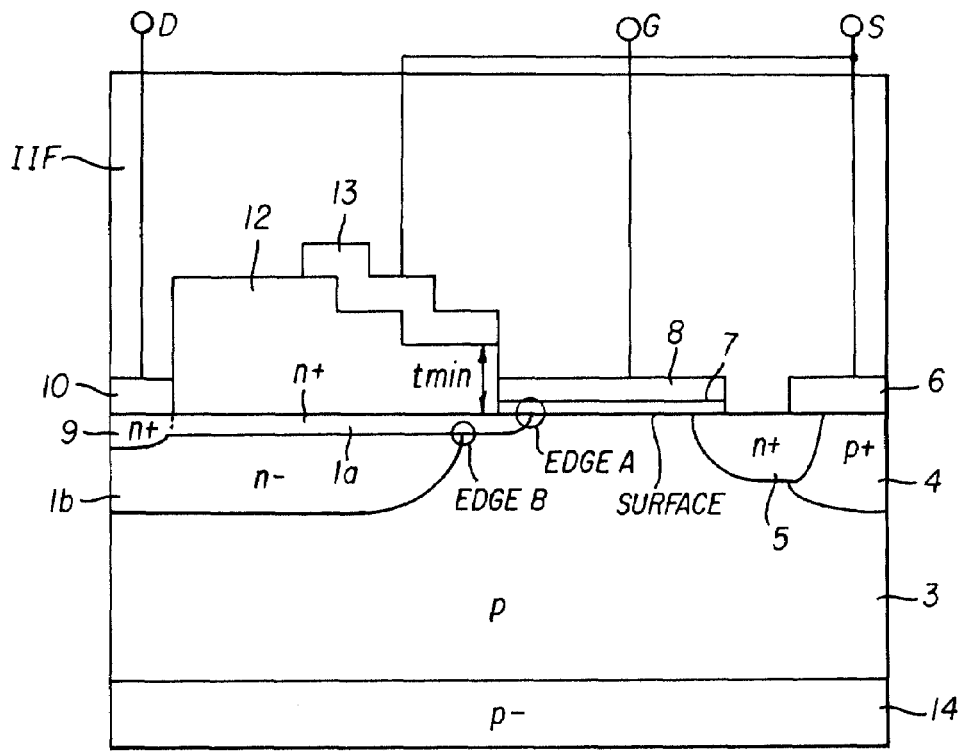
FIG. 15 is a cross sectional view of a tenth embodiment of a MIS-type semiconductor device according to the present invention.

FIG. 15 is a cross sectional view of a tenth embodiment of a MIS-type semiconductor device according to the present invention. FIG. 15 shows half the unit cell in a lateral planar MOSFET. Here, the MIS-type semiconductor device includes an $n^+$-type drift region $1a$ formed in the surface portion of a p-type base region 3 by implanting arsenic ions using a gate electrode 8 as a part of the mask and by subsequent laser annealing. It also includes an $n^-$-type drift region $1b$ formed prior to and below the $n^+$-type drift region $1a$ by implanting phosphorus ions at a high energy and by subsequent furnace annealing. In some cases, the impurity concentration peaks are distributed by implanting phosphorus ions multiple times at different energies to obtain more uniform impurity distribution in $n^-$-type drift region $1b$.

Alternatively, the p-type base region 3 can be formed by epitaxial growth on the $p^-$-type substrate 14, an $n^-$-type layer can be formed by epitaxial growth on the p-type base region 3, and a part of the $n^-$-type layer can be counter-doped with boron ions. The portion of the $n^-$-type epitaxial layer, the conductivity type thereof is changed to the p-type by the counter-doping, becomes a part of the p-type base region 3 extending from the vicinity of the gate to the vicinity of the source. The portion of the $n^-$-type epitaxial layer, the conductivity type thereof is unchanged by the counter-doping, corresponds to the $n^-$-type drift region $1b$. Then, the $n^+$-type drift region $1a$ is formed on the $n^-$-type drift region $1b$.

In the structure formed by any of the methods described above, the gate electrode 8 and the $n^+$-type drift region $1a$ overlap in a narrow area, and the $n^-$-type drift region $1b$ is positioned behind the $n^+$-type drift region $1a$, as seen from the side of gate electrode 8. The structure, which prevents the edge B of the $n^-$-type drift region $1b$ from being positioned more closely to the surface portion of the p-type base region 3 (the semiconductor chip surface) than the edge A of the $n^+$-type drift region $1a$, facilitates to reduce the feedback capacitance. The $n^-$-type drift region $1b$ is larger in volume than the $n^+$-type drift region $1a$. A field plate 13 is formed above the surface portion of the $n^+$-type drift region $1a$ near the gate electrode 8 with an oxide film 12 interposed between the $n^+$-type drift region $1a$ and the field plate 13. The field plate 13 is connected electrically to a source electrode 6. The oxide film 12 has steps similar to the first embodiment. By appropriately setting the number of the steps, the width of each step, and the height of each step, the electric field around the oxide film 12 can be relaxed effectively.

Although relaxation of the electric field in the vicinity of the gate electrode 8 is important to prevent the gate insulation film 7 from being deteriorated, avalanche breakdown should be made to occur in the region away from the gate insulation film 7 for obtaining a very reliable MIS-type semiconductor device. For facilitating this, it is preferable to set the avalanche voltage (the breakdown voltage) of the pn-junction (the built in diode) formed between the n⁻-type drift region 1b and the p-type base region 3 to be lower than the avalanche voltage (the breakdown voltage) of the pn-junction (the built in diode) formed between the n⁺-type drift region 1a and the p-type base region 3. It is more preferable to set the avalanche voltage (the breakdown voltage) of the pn-junction (the built in diode) formed between the n⁺-type drift region 5 and the p-type base region 3 to be lower than the avalanche voltage (the breakdown voltage) of the pn-junction (the built in diode) formed between the n⁺-type drift region 1a and the p-type base region 3.

The preferable avalanche voltage scheme is obtained by making the effective impurity concentration in the n⁻-type drift region 1b or the p-type base region 3 deviate a little bit from the optimum value. For intentionally making avalanche breakdown occur between the n⁻-type drift region 1b and the p-type base region 3, it is more preferable to raise the impurity concentration in the n⁻-type drift region 1b than to raise the impurity concentration in the p-type base region 3 from the view point of reducing the ON-resistance.

Now the points to consider in forming n⁺-type drift region 1a and n⁻-type drift region 1b will be described below. For reducing the feedback capacitance, the n⁺-type drift region 1a is positioned near the gate electrode 8 such that the n⁺-type drift region 1a overlaps the gate electrode 8 in a very narrow area as shown in FIG. 15. For example, by implanting impurity ions for forming the n⁺-type drift region 1a using the gate electrode 8 as a part of the mask, the n⁺-type drift region 1a is positioned precisely without deviations, since the overlapping area of the n⁺-type drift region 1a and the gate electrode 8 can be controlled in a self-aligned manner.

Arsenic ion is selected as an ion species in manufacturing an n-channel semiconductor device for effectively minimizing the overlapping area of the n⁺-type drift region 1a and the gate electrode 8, since arsenic ion hardly diffuses in the semiconductor chip. By employing laser annealing, as described above, to activate the impurity introduced by ion implantation, the introduced impurity is prevented more effectively from diffusing in the semiconductor chip.

The similar considerations tell that it is important not to heat the n⁺-type drift region 1a near the gate electrode 8 as much as possible in the manufacturing process. From the foregoing viewpoint, the n⁺-type drift region 1a should be formed in the late step. In many cases, the n⁻-type drift region 1b is formed in a wide region by thermally driving the impurity. Therefore, it is preferable to form the n⁺-type drift region 1a at least after the thermal drive step for forming the n⁻-type drift region 1b is over.

For obtaining a high carrier mobility over the entire drift region, it is required to form the n⁻-type drift region 1b uniformly in a wide region. For forming the n⁻-type drift region 1b uniformly in a wide region, an impurity is implanted at a high energy and the implanted impurity is diffused thermally. This procedure facilitates forming the n⁻-type drift region 1b widely in a semiconductor chip. By employing multiple ion implantation, more uniform impurity distribution is facilitated. Phosphorus ion is used conveniently in manufacturing an n-channel semiconductor device, since the phosphorus ion diffuses relatively easily in the semiconductor chip. An insulation film, formed beside the gate electrode 8 by depositing insulation layers (not shown) after the formation of the gate electrode 8 and by etching back the deposited insulation layers, works as a wall. By using the remaining insulation film (the wall) as a part of the mask for ion implantation, the n⁻-type drift region 1b is arranged precisely with little positional deviations.

Alternatively, the n⁻-type drift region 1b can be formed by epitaxial growth. For securing a certain breakdown voltage in the OFF-state of the device, it is ideal for the depletion layer to expand uniformly into the drift region. Since the impurity concentration is almost constant in the epitaxial layer, an irregular potential distribution is hardly caused and the electric field hardly localizes to a specific location.

When the n⁺-type drift region 1a is formed in close proximity to the gate electrode 8, the field plate 13 is formed above the n⁺-type drift region 1a with the insulation film 12 interposed between the n⁺-type drift region 1a and the field plate 13 to relax the electric field around the n⁺-type drift region 1a and the gate electrode 8. This configuration makes it easier for the depletion layer to expand to the side of the drift region due to the influence of the potential of the field plate 13 and, therefore, the electric field gradient near the gate electrode 8 becomes gentle. It is not always necessary for the field plate 13 to cover the entire n⁺-type drift region 1a. It is sufficient for the field plate 13 to cover only a part of the n⁺-type drift region 1a. It is effective to dispose the field plate 13 near the gate electrode 8. The field plate 13 will operate stably, if the potential thereof is fixed.

The switching speed in the structure, in which a field plate for relaxing the electric field is formed as an extension of the gate electrode, is low since the capacitance of the insulation film below the field plate is added to the feedback capacitance. In contrast, the field plate 13 according to the present invention, insulated from the gate electrode 8 but connected to the source electrode 6, facilitates relaxing of the electric field and reducing the feedback capacitance.

Figure 16:
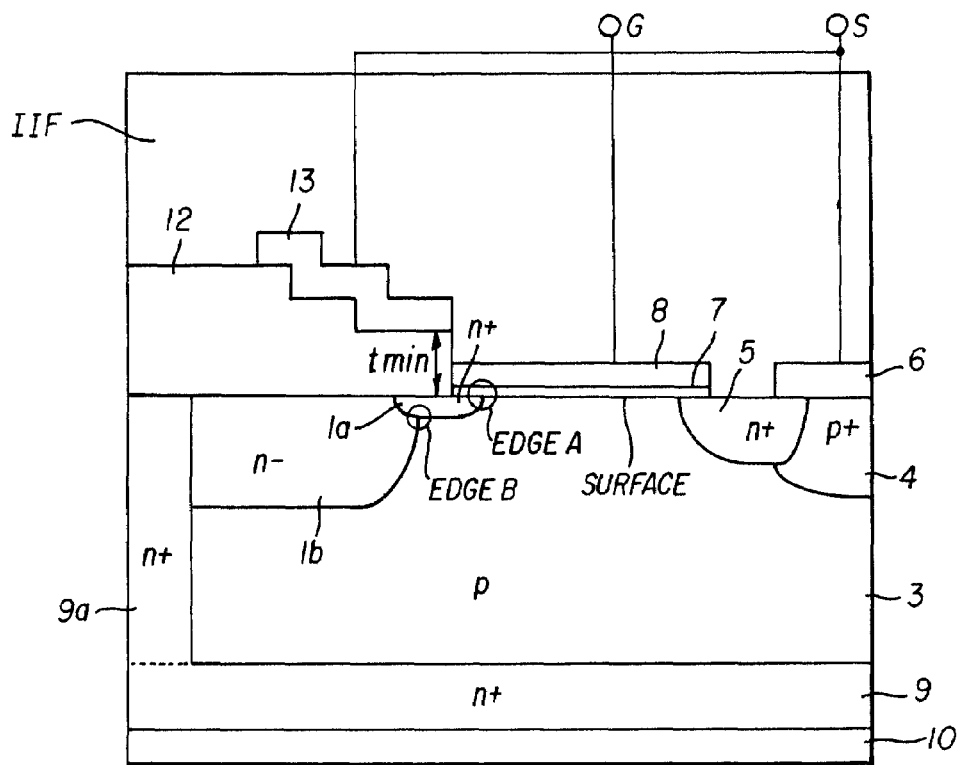
FIG. 16 is a cross sectional view of an eleventh embodiment of a MIS-type semiconductor device according to the present invention.

FIG. 16 is a cross sectional view of an eleventh embodiment of a MIS-type semiconductor device according to the present invention. FIG. 16 shows half the unit cell in a vertical planar MOSFET. Here, the n⁺-type drift region 1a is disposed only in the vicinity of the gate electrode 8. This configuration facilitates securing of a certain breakdown voltage, doping the n⁺-type drift region 1a heavily, and enlarging the volume of the n⁻-type drift region 1b. Although the semiconductor device according to the eleventh embodiment is of a vertical type, it can be manufactured in almost the same way as the semiconductor device according to the tenth embodiment, as the MOS structures near the surfaces of the semiconductor chips thereof are almost the same as each other. An n⁺-type drain region (n⁺-type plug region) 9a is formed by implanting impurity ions into the sidewall of a trench or by burying an electrical conductor into the trench. By positioning the edge B of the n⁻-type drift region 1b behind the n⁺-type drift region 1a, as seen from the side of the gate electrode 8, such that the edge B of the n⁻-type drift region 1b is not exposed to the surface of the p-type base region 3 (the semiconductor chip), low feedback capacitance can be realized.

Figure 17:
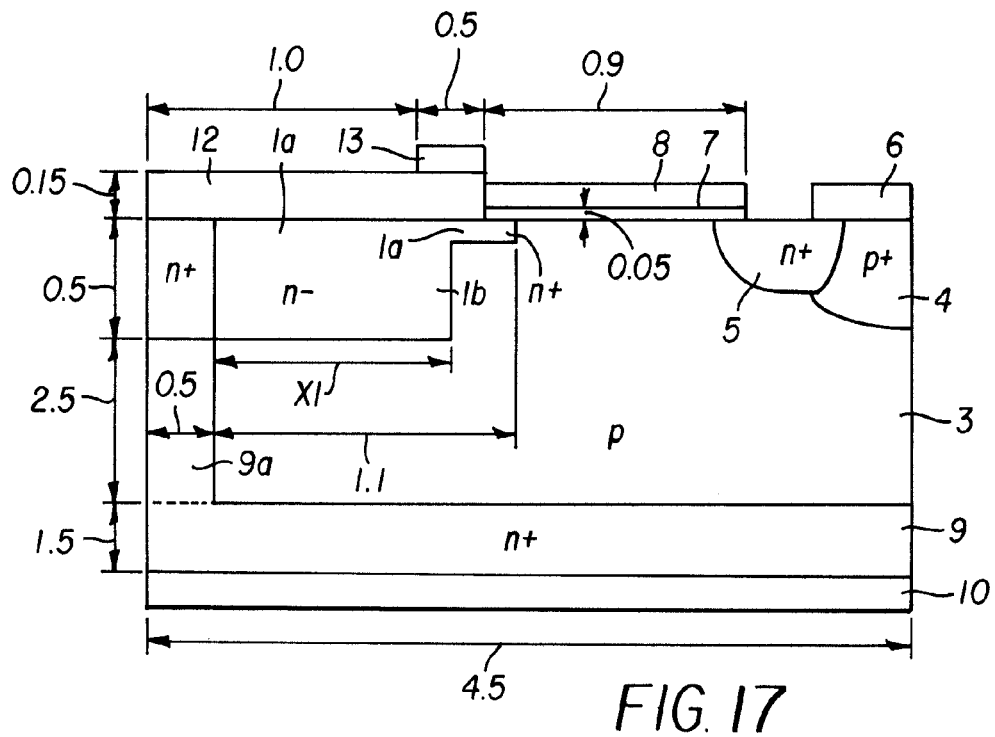
FIG. 17 is a diagram modeling the structure of FIG. 16.

By modeling the structure described above as shown in FIG. 17, it has been confirmed by simulation that low on-capacitance and low ON-resistance can be achieved simultaneously in one semiconductor device. For reducing the capacitance between the gate and the drain, the overlap of the gate electrode 8 and the n⁺-type drift region 1a is shortened down to 0.1 μm in FIG. 17, and X1 is defined as a parameter for changing the ratio of the n⁺-type drift region 1a and the n⁻-type drift region 1b. The field plate 13 is formed on a flat oxide film 12. Even when the oxide film 12 is shaped with a flat plate, the electric field around field plate 13 can be relaxed by adjusting the thickness of the oxide film 12 and the length of the field plate 13 appropriately.

Figure 18:
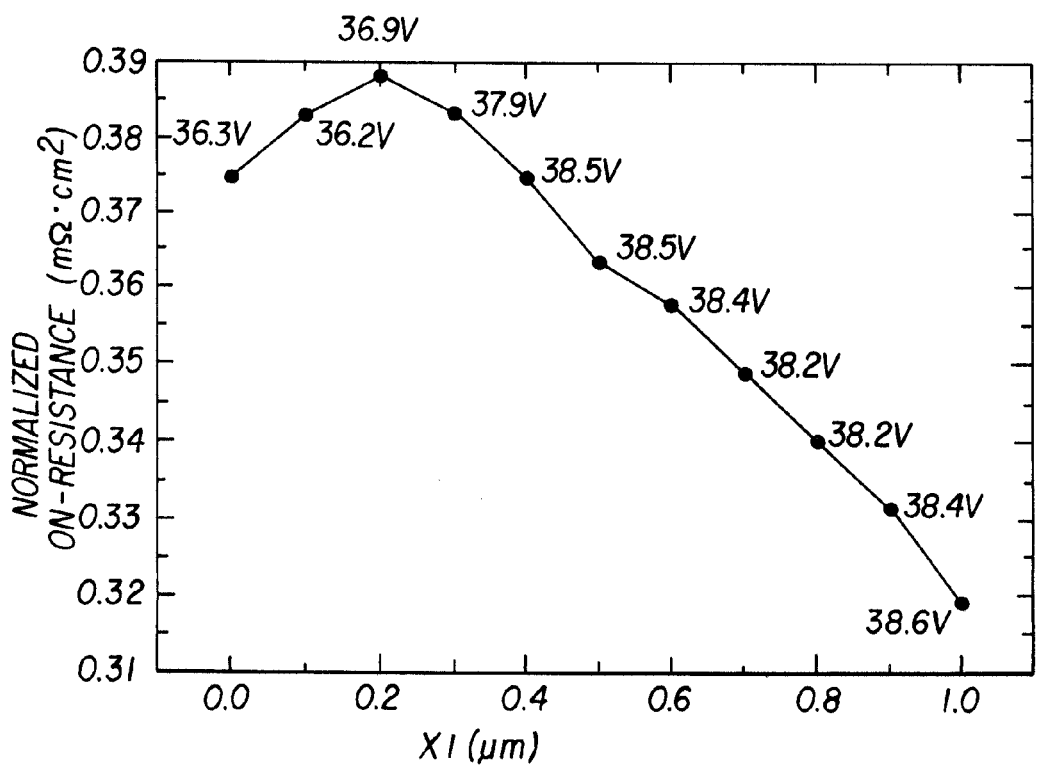
FIG. 18 shows a curve relating the normalized ON-resistance and the normalized length X1 of the lightly doped drift region with each other.

FIG. 18 shows a curve relating the normalized ON-resistance and the length X1 with each other. When the length X1 is too short, an ineffective region is formed, since the ON-current reaches the n⁺-type drain region 9a before spreading widely in the n⁻-type drift region 1b. As a result, the normalized ON-resistance rises. As the length X1 exceeds 0.4 μm toward the longer side, the region, in which the ON-current flows with high carrier mobility, is widened, compensating the disadvantage of the ineffective region. Therefore, the normalized ON-resistance lowers linearly as the length X1 increases from 0.4 μm.

Figure 19:
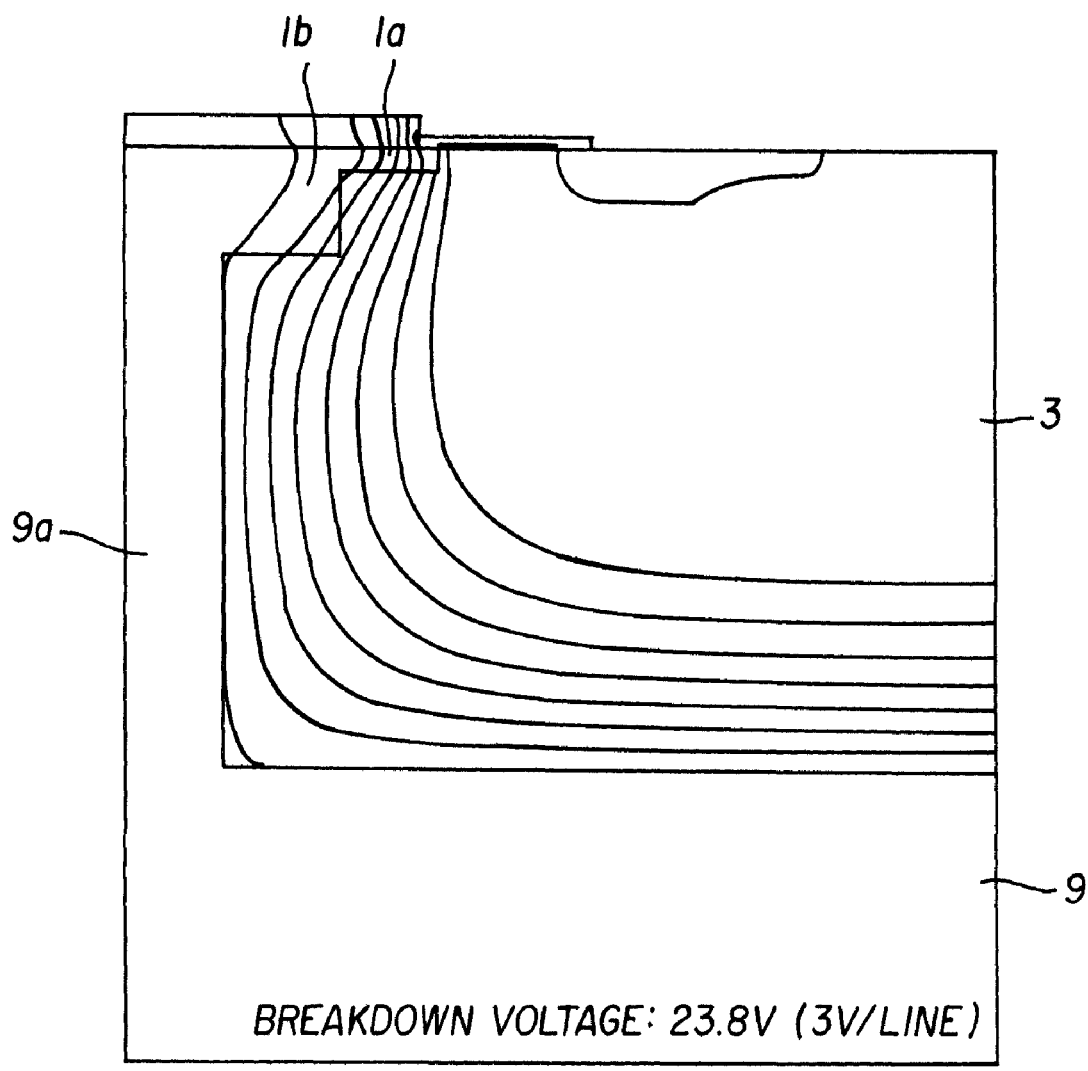
FIG. 19 shows a potential distribution in the OFF-state of the semiconductor device having no field plate.
Figure 20:
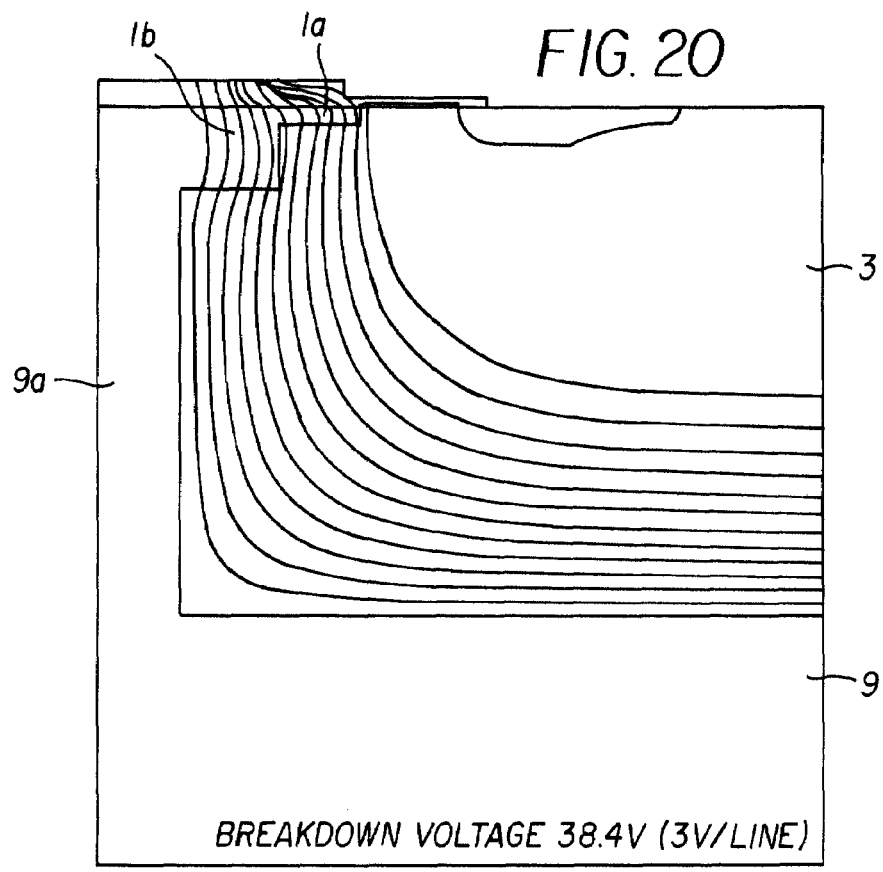
FIG. 20 shows a potential distribution in the OFF-state of the semiconductor device having a field plate.

The effectiveness of field plate 13 is confirmed also by simulation. FIG. 19 shows a potential distribution in the OFF-state of the semiconductor device, in which the length X1 is 0.6 μm and no field plate 13 is disposed. FIG. 20 shows a potential distribution in the OFF-state of the semiconductor device, in which the length X1 is 0.6 μm and the field plate 13 is disposed. These figures indicate that field plate 13 facilitates expanding of the depletion layer uniformly into the n⁺-type drift region 1a or the n⁻-type drift region 1b and securing a certain breakdown voltage efficiently. The oxide film 12, which is 0.15 μm in thickness, is thicker than the gate insulation film 7, which is 50 nm in thickness. The thickness of the oxide film 12 is smaller than the ratio of the breakdown voltage of the device to the critical dielectric breakdown strength of silicon $Vb/Ec=38.4$ $V/(5\times10^5$ V/cm), which is about 0.77 μm.

Figure 21:
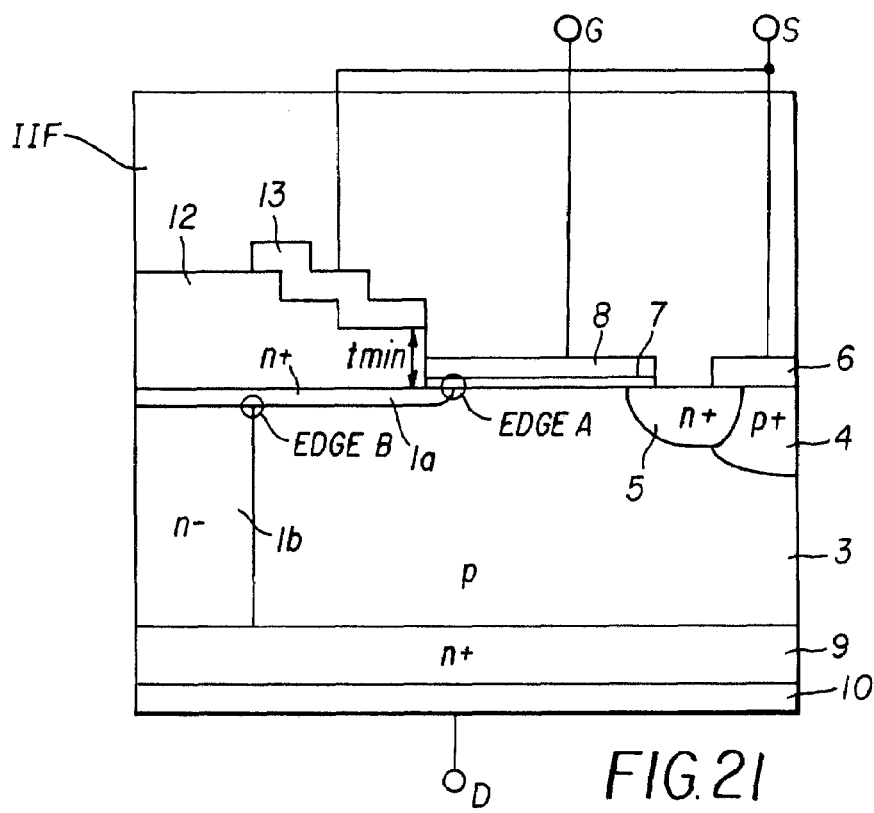
FIG. 21 is a cross sectional view of a twelfth embodiment of a MIS-type semiconductor device according to the present invention.

FIG. 21 is a cross sectional view of a twelfth embodiment of a MIS-type semiconductor device according to the present invention. FIG. 21 shows half the unit cell in a vertical planar MOSFET. Here, the semiconductor device includes an n⁺-type drift region 1a in the surface portion of the semiconductor chip and an n⁻-type drift region 1b replacing the n⁺-type drain region 9a of the semiconductor device according to the eleventh embodiment shown in FIG. 16. Since the n⁻-type drift region 1b and the p-type base region 3 are arranged like a vertical alternating conductivity type layer, the arrangement described above facilitates obtaining of a semiconductor device that exhibits a relatively high breakdown voltage and reduces the tradeoff relation between the breakdown voltage and the normalized ON-resistance. The conventional techniques for manufacturing a super junction semiconductor device (including an alternating conductivity type layer) such as repetition of epitaxial growth and masking ion implantation, ion implantation into the trench side wall, and filling a trench with epitaxial growth layers are employable for manufacturing the semiconductor device according to the twelfth embodiment. The feedback capacitance of the semiconductor device according to the twelfth embodiment is reduced by positioning the edge B of the n⁻-type drift region 1b behind the n⁺-type drift region 1a, as seen from the side of the gate electrode 8, so that the edge B of the n⁻-type drift region 1b can not be exposed to the surface of p-type base region 3 (the semiconductor chip).

Figure 22:
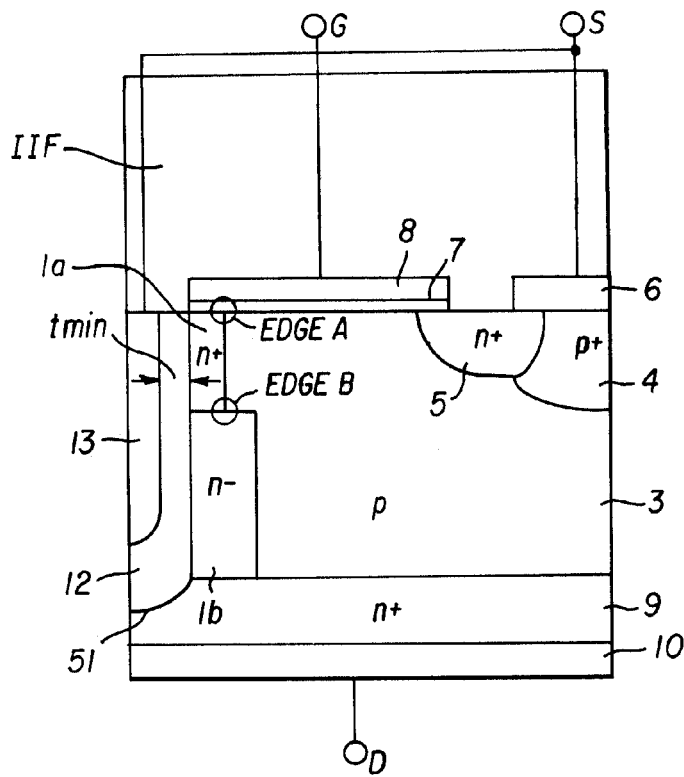
FIG. 22 is a cross sectional view of a thirteenth embodiment of a MIS-type semiconductor device according to the present invention.

FIG. 22 is a cross sectional view of a thirteenth embodiment of a MIS-type semiconductor device according to the present invention. FIG. 22 shows half the unit cell in a vertical planar MOSFET. Here, the semiconductor device includes an n⁺-type drift region 1a extending in perpendicular to the surface of the semiconductor chip. This structure is advantageous to narrow the width of the unit cell. The n⁺-type drift region 1a is formed, for example, by implanting impurity ions obliquely at deep degrees of angle to the sidewall of a trench using a gate electrode 8 as a part of the mask. A field plate 13 is in the trench. The edge B of the n⁻-type drift region 1b is positioned more deeply than the edge A of the n⁺-type drift region 1a. In other words, the edge B of the n⁻-type drift region 1b is positioned behind the n⁺-type drift region 1a, if seen from the side of gate electrode 8, such that the edge B of the n⁻-type drift region 1b is not exposed to the surface of the semiconductor chip. By positioning the edge B of the n⁻-type drift region 1b as described above, the feedback capacitance is reduced.

Figure 23:
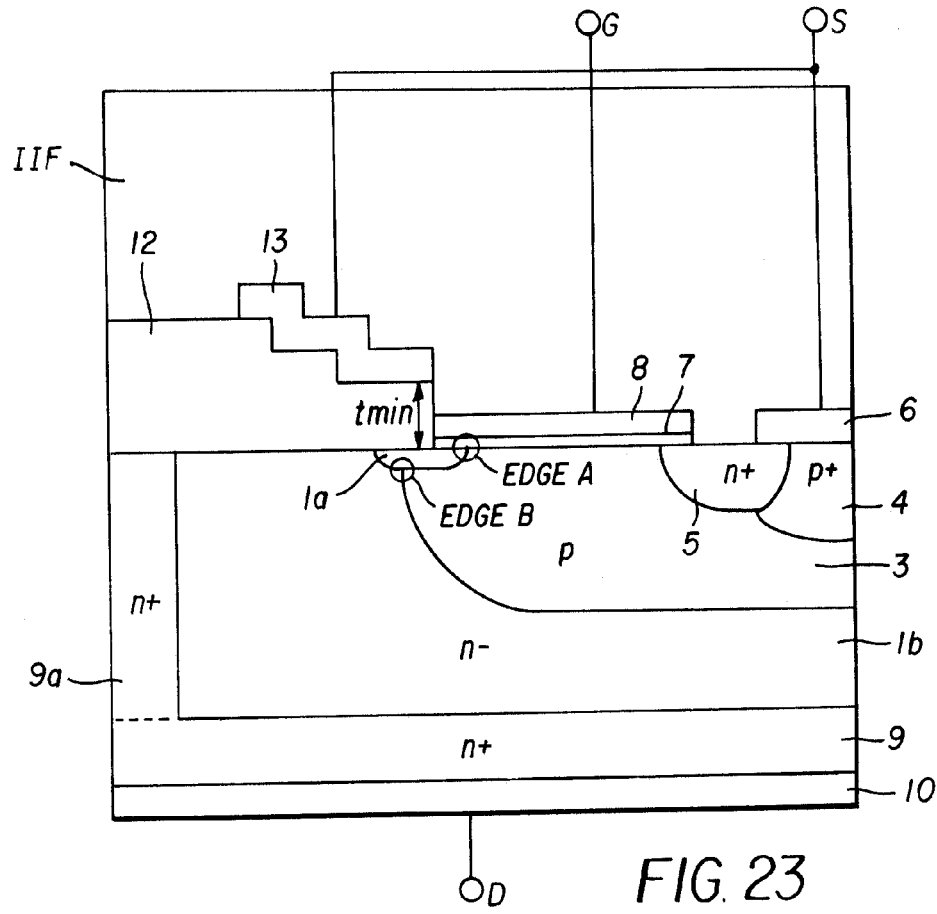
FIG. 23 is a cross sectional view of a fourteenth embodiment of a MIS-type semiconductor device according to the present invention.

FIG. 23 is a cross sectional view of a fourteenth embodiment of a MIS-type semiconductor device according to the present invention. FIG. 23 shows half the unit cell in a vertical planar MOSFET. Here, the semiconductor device has a structure similar to the structure of the semiconductor device according to the eleventh embodiment, formed using epitaxial layers. The MOS structure is formed by double diffusion into an n⁻-type epitaxial layer. The remaining portion of the n⁻-type epitaxial layer constitutes an n⁻-type drift region 1b. The edge B of the n⁻-type drift region 1b is positioned more deeply than the edge A of an n⁺-type drift region 1a. In other words, the edge B of the n⁻-type drift region 1b is positioned behind an n⁺-type drift region 1a, as seen from the side of the gate electrode 8, such that the edge B of the n⁻-type drift region 1b is not exposed to the surface of the semiconductor chip. By positioning the edge B of the n⁻-type drift region 1b as described above, the feedback capacitance can be reduced.

Figure 24:
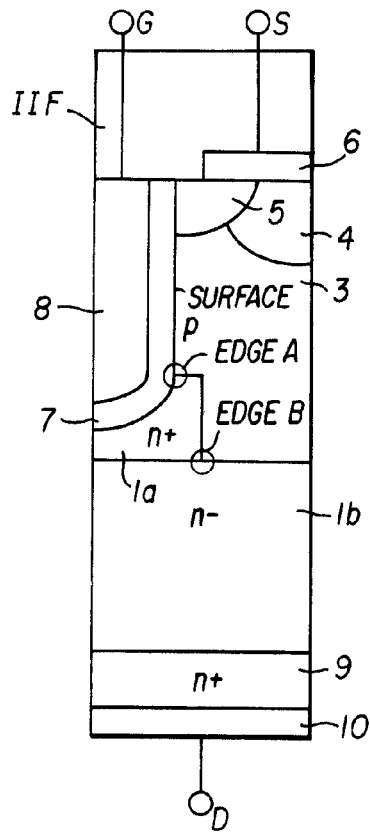
FIG. 24 is a cross sectional view of a fifteenth embodiment of a MIS-type semiconductor device according to the present invention.

FIG. 24 is a cross sectional view of a fifteenth embodiment of a MIS-type semiconductor device according to the present invention. FIG. 24 shows half the unit cell in a vertical trench MOSFET. Here, the MOSFET has a trench gate. At first, arsenic ions are implanted at a high dose amount in advance into the bottom portion of the trench dug into an n⁻-type epitaxial layer. Then, counter doping is conducted from the trench surface. Then, a p-type base region 3 is formed by diffusing the introduced impurities deeply, leaving an n⁺-type drift region 1a only in the portion of the semiconductor chip near the trench gate. It is convenient to employ the oxide mask used in digging the trench as a mask for implanting arsenic ions into the bottom portion of the trench, since the manufacturing steps are simplified. The edge B of the n⁻-type drift region 1b is positioned more deeply than the edge A of an n⁺-type drift region 1a. In other words, the edge B of the n⁻-type drift region 1b is positioned behind the n⁺-type drift region 1a, as seen from the side of the gate electrode 8, such that the edge B of the n⁻-type drift region 1b is not exposed to the surface of the p-type base region 3. By positioning the edge B of the n⁻-type drift region 1b a described above, the feedback capacitance can be reduced.

Figure 25:
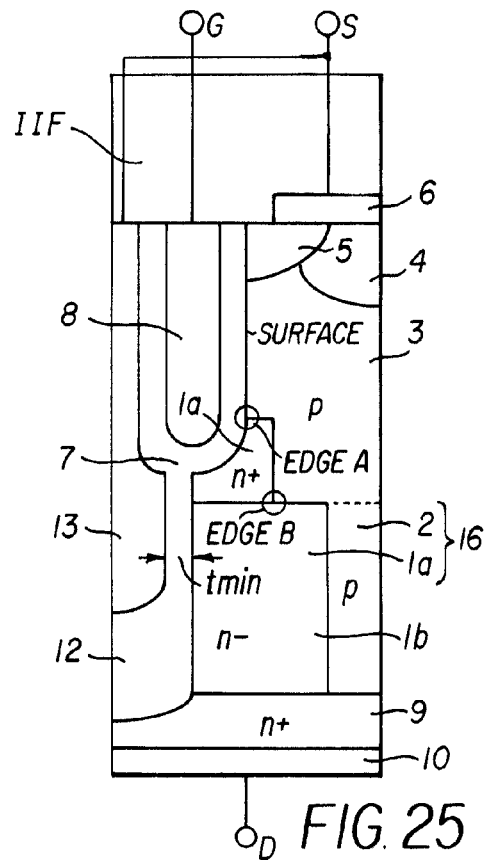
FIG. 25 is a cross sectional view of a sixteenth embodiment of a MIS-type semiconductor device according to the present invention.

FIG. 25 is a cross sectional view of a sixteenth embodiment of a MIS-type semiconductor device according to the present invention. FIG. 25 shows half the unit cell in a vertical trench MOSFET. Here, the MOSFET has a trench gate in the same manner as the MOSFET of FIG. 24. In sixteenth embodiment, however, the trench is formed more deeply than the gate, and the field plate 13 is disposed in the trench. An alternating conductivity type layer 16 consisting of the n⁻-type drift regions 1b and the p-type partition regions 2 is formed below an n⁺-type drift region 1a using the conventional technique for forming an alternating conductivity type layer. If the gate is on the trench side wall, the impurity for forming the n⁺-type drift region 1a can be introduced by the self-alignment technique employing the gate as a part of the mask for oblique ion implantation. The edge B of the n⁻-type drift region 1b is positioned more deeply than the edge A of an n⁺-type drift region 1a. In other words, the edge B of the n⁻-type drift region 1b is positioned behind the n⁺-type drift region 1a, as seen from the side of the gate electrode 8, such that the edge B of the n⁻-type drift region 1b is not exposed to the surface of the p-type base region 3. By positioning the edge B of the n⁻-type drift region 1b as described above, the feedback capacitance can be reduced.

Although the MIS-type semiconductor devices according to the tenth through sixteenth embodiments include field plate 13, it is not always necessary to form a field plate 13.

Figure 26:
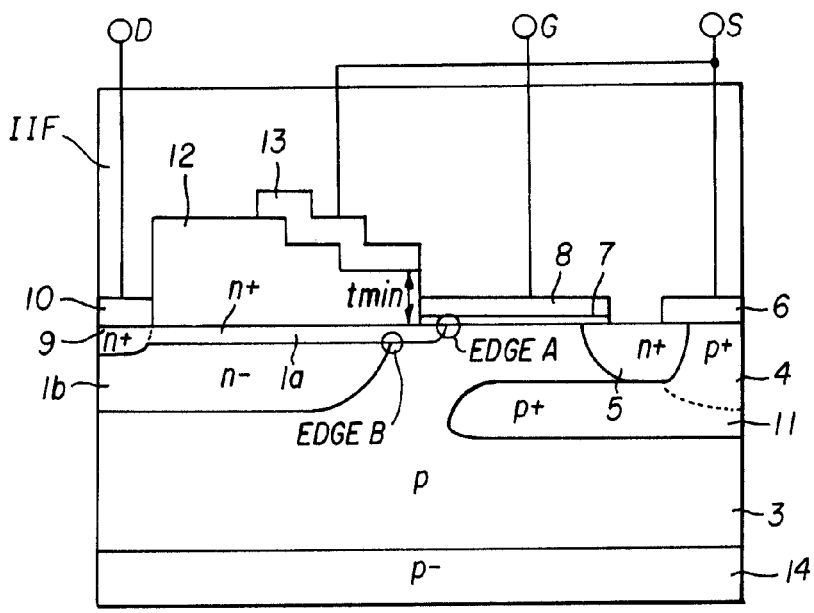
FIG. 26 is a cross sectional view of a seventeenth embodiment of a MIS-type semiconductor device according to the present invention.
Figure 27:
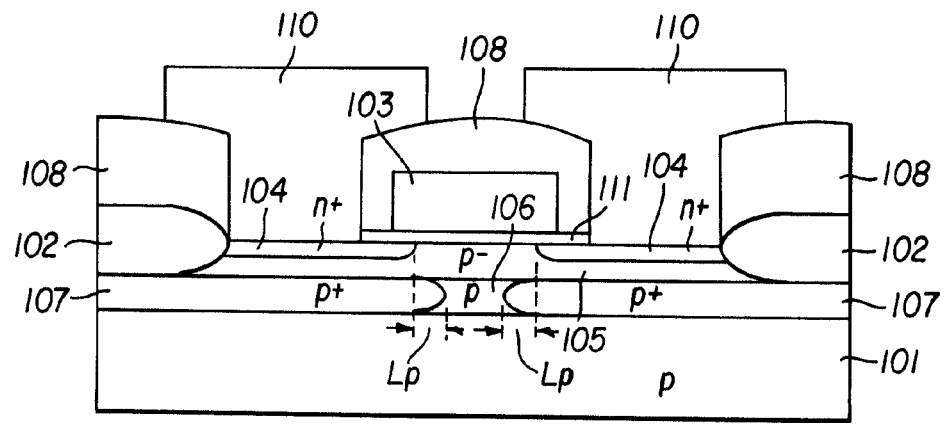
FIG. 27 is a cross sectional view of a conventional MIS-type semiconductor device.
Figure 28:
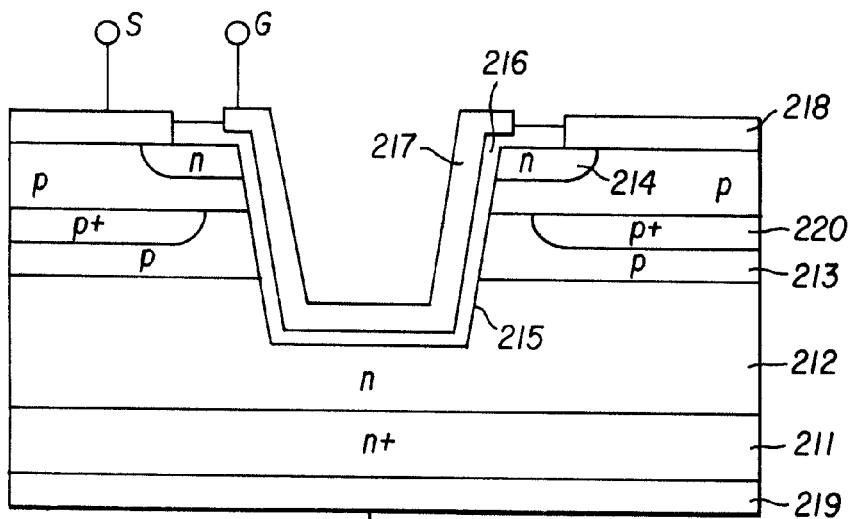
FIG. 28 is a cross sectional view of another conventional MIS-type semiconductor device.
Figure 29:
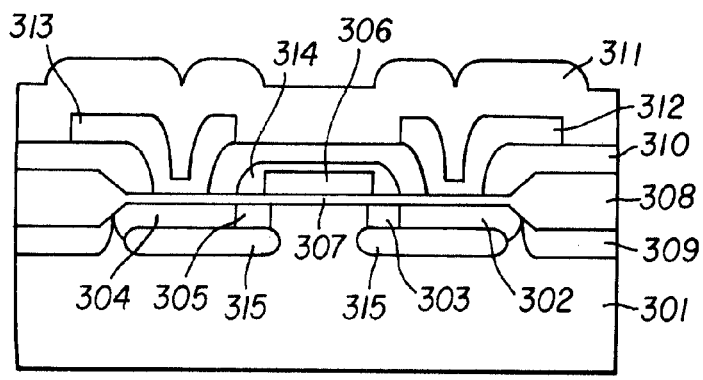
FIG. 29 is a cross sectional view of still another conventional MIS-type semiconductor device.

FIG. 26 is a cross sectional view of a seventeenth embodiment of a MIS-type semiconductor device according to the present invention. FIG. 26 shows half the unit cell in a lateral planar MOSFET. Here, the lateral planar MOSFET basically has a similar structure as shown in FIG. 15, to which a p⁺-type stopper region (depletion layer stopper) 11 is added. By positioning the edge B of the n⁻-type drift region 1b behind an n⁺-type drift region 1a, as seen from the side of the gate electrode 8, such that the edge B of the n⁻-type drift region 1b is not exposed to the surface of a p-type base region 3 (the semiconductor chip), the feedback capacitance can be reduced. The p⁺-type stopper region 11 added is very effective to reduce the capacitance between the gate and the drain (the feedback capacitance), since the p⁺-type stopper region 11 prevents the depletion layer from expanding below gate electrode 8.

Although the MIS-type semiconductor devices according to the tenth through sixteenth embodiments do not include any p⁺-type stopper region 11, the MIS-type semiconductor devices according to the tenth through sixteenth embodiments will exhibit the same effects as the MIS-type semiconductor device according to the seventeenth embodiment does, if a p⁺-type stopper region 11 is added as shown in FIG. 26. When the p⁺-type stopper region 11 is added, the spacing x, the spacing dg, and the position P of the impurity concentration peak described in connection with the MIS-type semiconductor devices according to the first through ninth embodiments can be set in the same way as in the MIS-type semiconductor devices according to the first through ninth embodiments. In setting the spacing x, the n⁺-type drift region 1a and the n⁻-type drift region 1b can be considered collectively as one n-type drift region 1.

By constituting an n-type drift region 1 in the MIS-type semiconductor devices according to the first through ninth embodiments from an n⁺-type drift region 1a and an n⁻-type drift region 1b in the same manner as in MIS-type semiconductor devices according to the tenth through sixteenth embodiments, and by positioning the edge of the n⁻-type drift region 1b behind n⁺-type drift region 1a so that the edge B of the n⁻-type drift region 1b can not be exposed to the surface of the p-type base region 3, the feedback capacitance can be further reduced.

The conventional techniques minimize the overlapping area between the gate electrode and the drift region so that the capacitance between the gate electrode and the drift region can be neglected. However, what contributes physically to the feedback capacitance is not always limited to the capacitance of the overlapping area between the gate electrode and the drift region. The capacitance of the portion, overlapping with the gate electrode, of the depletion layer expanding into the base region in the OFF-state of the device is also involved in the feedback capacitance. Therefore, for reducing the feedback capacitance, it is necessary to prevent the depletion layer from expanding below the gate electrode in the OFF-state of the device as well as to narrow the overlapping area between the gate electrode and the drift region. The inventor of the present invention has confirmed by simulation that the charge amount accumulated between the gate and the drain in switching is reduced by suppressing the depletion layer expansion to the portion of the semiconductor chip below the gate electrode.

For preventing the depletion layer from expanding below the gate electrode in the OFF-state of the device, it is effective to dispose a heavily doped region (stopper region), which will remain as a not-depleted region, near the boundary between the drift region and the base region and to make the heavily doped region work as a depletion layer stopper.

When the spacing dg between the heavily doped stopper region and the gate oxide film is too wide, the depletion layer expands also into the base region below the gate electrode, causing large feedback capacitance. Therefore, it is necessary to confine the spacing dg within a certain range preferably 2.5 μm or narrower, and more preferably, 1 μm or narrower.

When the spacing x between the heavily doped stopper region and the drift region is too wide for the depletion layer to reach the heavily doped region, the heavily doped region does not work as a depletion layer stopper and the depletion layer expands widely into the portion of the base region below the gate electrode, causing large feedback capacitance. Therefore, it is necessary to confine the spacing x within a certain range preferably 5.6 μm or narrower.

By positioning the peak of the impurity concentration in the section of the base region close and parallel to the gate insulation film more closely to the drift region, it becomes possible to prevent the depletion layer from expanding from the drift region to the source region. By suppressing the depletion layer expansion, the feedback capacitance is reduced. The peak impurity concentration can be adjusted at a value, at which an optimum threshold gate voltage is obtained.

By adjusting the minimum thickness of the insulation film below the field plate to be equal to or larger than the thickness of the gate insulation film and to be equal to or smaller than the ratio Vb/Ec, a breakdown voltage higher than the gate breakdown voltage is obtained for the device and the depletion layers expanding into the drift region below the field plate and into the base region are spread effectively.

The functions of the structure, including a field plate above a drift region with an insulation film interposed between the field plate and the drift region, will be further described below. It is necessary to set the insulation film at an appropriate thickness, since the effect of the field plate for controlling the depletion layer expansion will be impaired, if the insulation film is too thick. For example, if changes are caused in the potential distribution, due to the effects of the field plate, by a reverse bias voltage applied gradually between the drain and the source in the OFF-state of the device, the electric field strength somewhere, affected most strongly by the potential distribution changes, in the vicinity of the semiconductor chip surface will reach the critical electric field strength Ec at first. When the critical electric field strength is caused somewhere near the semiconductor chip surface, the electric field strength in the insulation film is estimated to be around the critical electric field strength Ec. For securing a breakdown voltage of around Vb by the insulation film, the field plate is expected to exhibit the effect of controlling the depletion layer expansion by adjusting the insulation film to be as thick as or thinner than Vb/Ec. It is not always necessary to adjust the insulation film to be uniform in thickness. If a field plate is spread in a wide area above the drift region with a thin insulation film interposed between the field plate and the drift region, the potential gradient in the semiconductor chip surface will become too steep, causing a lower breakdown voltage. The field plate is disposed above the drift region with a thin insulation film interposed therebetween mainly to relax the electric field near the gate insulation film. Therefore, it is effective to set the insulation film beneath the field plate to be thin only in the vicinity of the gate insulation film. By electrically connecting the field plate to the source electrode, the field plate potential is fixed at the source potential and, therefore, the field plate plays the rolls thereof stably.

Since the field plate facilitates depletion layer expansion on the side of the drift region, a certain breakdown voltage is obtained easily and the ON-resistance is reduced by increasing the impurity concentration in the drift region.

Although the insulation film under the field plate can be made of any insulator, an oxide film formed through a relatively simple step such as thermal oxidation is preferable for obtaining a stable insulation film.

The drift region is formed of a heavily doped first drift region and a lightly doped second drift region. The heavily doped first drift region overlaps with the gate electrode. The edge of the lightly doped second drift region is positioned behind the heavily doped first drift region, if seen from the side of the gate electrode, such that the edge of the lightly doped second drift region is not exposed to the surface of the base region beneath the gate electrode. In other words, the edge of the lightly doped second drift region is positioned more deeply than the edge of the heavily doped first drift region such that the edge of the lightly doped second drift region is not in the surface of the base region beneath the gate electrode. In the trench gate structure, the edge of the lightly doped second drift region is not in the surface of the base region beside the gate electrode. Since the portion of the drift region overlapping with the gate electrode is doped heavily, the overlapping portion of the drift region can be narrowed while keeping the impurity concentration therein at a sufficiently high value. By making the ON-current flow in the lightly doped second drift region, the carrier mobility in the drift region is prevented from lowering. Since the ON-current flowing by virtue of a high carrier mobility is increased by forming the lightly doped second drift region more widely than the heavily doped first drift region as far as the breakdown voltage is secured, the ON-resistance is reduced efficiently.

Since the portion that should be doped heavily is limited to the vicinity of the gate electrode, to which an ON-current is injected from the channel, it is more preferable to dispose the heavily doped first drift region only in a very small region below the gate electrode and to dispose the lightly doped second drift region in the most part of the remaining region.

In detail, the lightly doped second drift region is taken out for a unit length in the direction, in which the ON-current flows. Hereinafter, the taken-out lightly-doped second drift region will be referred to as the "unit lightly-doped drift region." The cross section of unit lightly-doped drift region is expressed by S and the effective impurity concentration in the unit lightly-doped drift region by ndrift. The cross section S corresponds to the volume of the unit lightly-doped drift region. If the product S X ndrift is estimated to be constant very simply, the cross section S can be changed without lowering the breakdown voltage of the device.

In other words, if the effective total impurity amount is constant, the total number of the electrons or the holes compensating in the OFF-state of the device will be unchanged. Therefore, if considered simply, the depletion layer will expand almost in the same manner, securing almost the same breakdown voltage. Although the resistivity is increased by the light doping in the drift region, the influence of the increased resistivity on the resistance is compensated completely by the widened cross section S of the ON-current path. As a result, only the mobility difference causes drift resistance change.

If the cross section S is too wide, the ON-current flowing out from the heavily doped first drift region, the cross section thereof is narrow, will spread. The spreading ON-current will cause an ineffective region, in which the ON-current does not flow. In designing practical semiconductor devices, it is important to find the widest cross section S while considering the ON-current distribution in the drift region so as not to impair the merits of the present invention. Although the cross section (volume) of the lightly doped second drift region is widened with respect to the cross section (volume) of the heavily doped first drift region, there exists an optimum cross sectional area for the lightly doped second drift region.

By increasing the effective impurity amount (total amount) in the unit lightly-doped (second) drift region more than the effective impurity amount (total amount) in the unit heavily-doped (first) drift region, the ON-resistance in the lightly doped second drift region is further reduced.

For reducing the capacity between the gate and the drain, it is useful to form a heavily doped stopper region for stopping the depletion layer (depletion layer stopper). Since the heavily doped drift region disposed beside the gate electrode is so minute, the depletion layer stopper formed in close proximity to the heavily doped drift region can be positioned very closely to the gate electrode. The depletion layer stopper positioned very closely to the gate electrode facilitates preventing effectively the depletion layer from expanding into the base region in contact with the gate insulation film.

The MIS-type semiconductor device according to an aspect of the invention includes a stopper region for stopping the depletion layer disposed in the vicinity of the boundary between the drift region and the base region below the gate electrode or a heavily doped portion in the base region near the drift region beneath the gate electrode. This MIS-type semiconductor device facilitates preventing of the depletion layer from expanding into the base region below the gate electrode and reducing the feedback capacitance (the capacitance between the gate and the drain).

By disposing a field plate in the vicinity of the drift region with a thin insulation film interposed between the field plate and the drift region, the electric field in the vicinity of the gate insulation film is relaxed and a certain breakdown voltage is secured.

The MIS-type semiconductor device according to another aspect of the invention includes a heavily doped drift region in the vicinity of the gate electrode and a lightly doped drift region positioned below the heavily doped drift region such that the edge of the lightly doped drift region is not exposed to the surface of the p-type base region (the semiconductor chip). The MIS-type semiconductor device configured as described above facilitates to securely connect the channel and the heavily doped drift region, reduce the overlapping area between the gate electrode and the heavily doped drift region, and reduce the feedback capacitance. The MIS-type semiconductor device including the lightly doped drift region also facilitates to obtain high carrier mobility and low ON-resistance. Thus, a MIS-type semiconductor device that exhibits low feedback capacitance and low ON-resistance can be obtained according to the invention.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosures of the priority applications, JP 2003-063161 and JP 2003-197644, in their entirety, including the drawings, claims, and the specifications thereof, are incorporated herein by reference.

What is claimed is:

1. A MIS-type semiconductor device comprising:
a base region of a second conductivity;
a source region of a first conductivity type in the surface of the base region;
a drift region of the first conductivity type in the surface of the base region and laterally spaced from the source region;
a gate insulation film on the surface of the base region between the source region and the drift region; and
a gate electrode formed on the gate insulation film,
wherein the base region in contact with the gate insulation film has an impurity concentration peak positioned more closely to the drift region than to the source region, and
wherein the drift region comprises a first drift region and a second drift region, the first drift region being doped heavier than the second drift region, at least a part the surfaces of the first drift region and the gate electrode overlap each other, and an edge of the second drift region is positioned farther from the gate electrode than the first drift region so that the second drift region is not exposed to the surface of the base region beneath the gate electrode.

2. The MIS-type semiconductor device according to claim 1, wherein the second drift region is larger in volume than the first drift region.

3. The MIS-type semiconductor device according to claim 1, wherein the diffusion depth of the second drift region is longer than the diffusion depth of the first drift region.

4. The MIS-type semiconductor device according to claim 1, wherein the net impurity amount per unit length in the second drift region is larger than the net impurity amount per a unit length in the first drift region.

5. The MIS-type semiconductor device according to claim 1, further including a drain region spaced from the first drift region.

6. A MIS-type semiconductor device comprising:
a base region of a second conductivity type;
a source region of a first conductivity type in the surface of the base region:
a drift region of the first conductivity type in contact with the base region;
a gate insulation film in the base region and extending between the source region and the drift region;
a gate electrode in contact with the gate insulation film; and
a semiconductor chip having a first major surface and a second major surface facing opposite to each other, a trench, and a drain region of the first conductivity type on the side of the second major surface, the drain region being connected to the drift region,
wherein the base region and the source region are on the side of the first major surface,
wherein the trench extends through the source region and extends into the base region,
wherein the gate electrode is in the trench or on the side wall of the trench with the gate insulation film interposed between the gate electrode and the trench,
wherein the drift region is in contact with the bottom of the trench,
wherein the drift region is below the gate electrode so that the drift region overlaps with the gate electrode projecting perpendicular to the second major surface, and
wherein the base region in contact with the gate insulation film has an impurity concentration peak positioned more closely to the drift region than to the source region.

7. A MIS-type semiconductor device comprising:
a base region of a second conductivity;
a source region of a first conductivity type in the surface of the base region;
a drift region of the first conductivity type in the surface of the base region and laterally spaced from the source region;
a gate insulation film on the surface of the base region between the source region and the drift region;
a gate electrode on the gate insulation film; and
a heavily doped region of the second conductivity type in the base region below the gate electrode,
wherein the heavily doped region is positioned between the source region and the drift region to enable a depletion layer expanding from the drift region into the base region reach the heavily doped region.

8. The MIS-type semiconductor device according to claim 7, wherein the drift region comprises a first drift region and a second drift region, the first drift region being doped heavier than the second drift region, at least a part of the surfaces of the first drift region and the gate electrode overlap each other, and an edge of the second drift region is positioned farther from the gate electrode than the first drift region so that the second drift region is not exposed to the surface of the base region beneath the gate electrode.

9. The MIS-type semiconductor device according to claim 8, wherein the second drift region is larger in volume than the first drift region.

10. The MIS-type semiconductor device according to claim 8, wherein the diffusion depth of the second drift region is longer than the diffusion depth of the first drift region.

11. The MIS-type semiconductor device according to claim 8, wherein the net impurity amount per a unit length in the second drift region is larger than the net impurity amount per a unit length in the first drift region.

12. The MIS-type semiconductor device according to claim 8, further including a drain region spaced from the first drift region.

13. A MIS-type semiconductor device comprising:
a source region of a first conductivity type;
a base region of a second conductivity type;
a drift region of the first conductivity type;
a gate insulation film on the base region between the source region and the drift region;
a gate electrode on the gate insulation film; and
a heavily doped region of the second conductivity type in the base region below the gate electrode,
wherein the heavily doped region is positioned between the source region and the drift region to enable a depletion layer expanding from the drift region into the base region reach the heavily doped region,
wherein an edge of the heavily doped region is spaced apart 2.5 µm or narrower from the gate insulation film and 5.6 µm or narrower from the drift region.

14. A MIS-type semiconductor device comprising:
a source region of a first conductivity type;
a base region of a second conductivity type;
a drift region of the first conductivity type;
a gate insulation film on the base region between the source region and the drift region;
a gate electrode on the gate insulation film; and
a heavily doped region of the second conductivity type in the base region below the gate electrode, wherein the heavily doped region is positioned between the source region and the drift region to enable a depletion layer expanding from the drift region into the base region reach the heavily doped region, wherein the edge of the heavily doped region is spaced apart 1 μm or narrower from the gate insulation film.

15. The MIS-type semiconductor device comprising:

a semiconductor chip having a first major surface and a second major surface facing opposite to each other;

a trench extending into the semiconductor chip from the first major surface;

a drain region of a first conductivity type on the side of the second major surface;

a base region of a second conductivity type in the semiconductor chin on the side of the second major surface;

a source region of the first conductivity type in the surface of the base region, the trench extending into the base region through the source region;

a drift region of the first conductivity type in contact with the base region;

a gate insulation film in the trench and extending between the source region and the drift region; and a gate electrode in the trench with the gate insulation film interposed between the gate electrode and the trench, wherein the drift region comprises a first drift region and a second drift region, the first drift region being doped heavier than the second drift region, wherein the first drift region is in contact with the gate insulation film, and wherein the drain region is connected to the second drift region.

16. A MIS-type semiconductor device comprising:

a base region of a second conductivity;

a drift region of a first conductivity type in the surface of the base region;

a source region of the first conductivity type in the surface of the base region and spaced laterally from the drift region;

a gate insulation film on the surface of the base region between the source region and the drift region;

a gate electrode formed on the gate insulation film; and a heavily doped region of the second conductivity type in the base region below the gate electrode, wherein the heavily doped region is positioned between the source region and the drift region to enable a depletion layer expanding from the drift region into the base region reach the heavily doped region, and wherein the base region in contact with the gate insulation film has an impurity concentration peak positioned more closely to the drift region than to the source region.

17. The MIS-type semiconductor device according to claim 16, wherein the impurity concentration in the source region is significantly higher than the impurity concentration in the drift region.

\* \* \* \* \*